(12) United States Patent
Leng

(10) Patent No.: US 12,396,185 B2
(45) Date of Patent: Aug. 19, 2025

(54) THIN-FILM RESISTOR (TFR) MODULE INCLUDING A TFR ELEMENT FORMED IN A METAL CUP STRUCTURE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 619 days.

(21) Appl. No.: 17/834,065

(22) Filed: Jun. 7, 2022

(65) Prior Publication Data

US 2023/0361159 A1    Nov. 9, 2023

Related U.S. Application Data

(60) Provisional application No. 63/338,121, filed on May 4, 2022.

(51) Int. Cl.
| | | |
|---|---|---|
| *H10D 1/47* | (2025.01) | |
| *H01C 7/00* | (2006.01) | |
| *H01C 17/075* | (2006.01) | |
| *H01L 21/768* | (2006.01) | |
| *H01L 23/522* | (2006.01) | |
| *H10D 86/85* | (2025.01) | |

(52) U.S. Cl.
CPC ............. *H10D 1/474* (2025.01); *H01C 7/006* (2013.01); *H01C 17/075* (2013.01); *H01L 21/76816* (2013.01); *H01L 21/76843* (2013.01); *H01L 23/5228* (2013.01); *H10D 86/85* (2025.01)

(58) Field of Classification Search
CPC .......... H10D 1/474; H10D 86/85; H10D 1/47; H01C 7/006; H01C 17/075; H01L 21/76816; H01L 21/76843; H01L 23/5228
See application file for complete search history.

(56) References Cited

U.S. PATENT DOCUMENTS

| | | |
|---|---|---|
| 10,818,748 B2 | 10/2020 | Leng et al. |
| 2010/0073122 A1* | 3/2010 | Le Neel ............... H01C 17/265 338/25 |
| 2019/0386091 A1 | 12/2019 | Sato et al. |

OTHER PUBLICATIONS

International Search Report and Written Opinion, Application No. PCT/US2022/048683, 12 pages, Feb. 27, 2023.

* cited by examiner

*Primary Examiner* — Robert G Bachner
(74) *Attorney, Agent, or Firm* — SLAYDEN GRUBERT BEARD PLLC

(57) ABSTRACT

A thin film resistor (TFR) module includes a metal cup structure, a dielectric liner region, a TFR element, and a pair of TFR heads electrically connected to the TFR element. The metal cup structure includes a laterally-extending metal cup base and multiple metal cup sidewalls extending upwardly from the laterally-extending metal cup base. The dielectric liner region is formed in an opening defined by the metal cup structure. The TFR element is formed in an opening defined by the dielectric liner region, wherein the TFR element is insulated from the metal cup structure by the dielectric liner region.

22 Claims, 17 Drawing Sheets

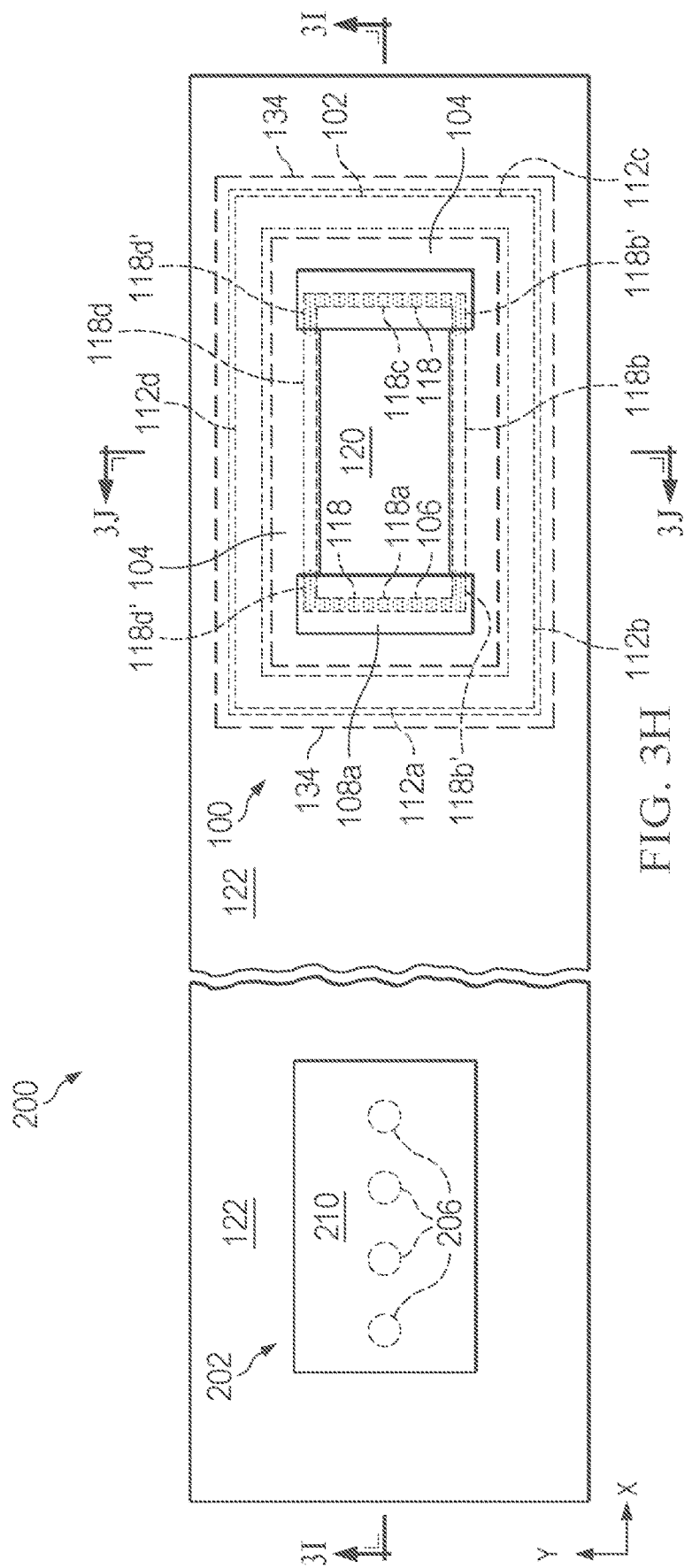

THIN-FILM RESISTOR (TFR) MODULE INCLUDING A TFR ELEMENT FORMED IN A METAL CUP STRUCTURE

RELATED PATENT APPLICATION

This application claims priority to commonly owned U.S. Provisional Patent Application No. 63/338,121 filed May 4, 2022, the entire contents of which are hereby incorporated by reference for all purposes.

TECHNICAL FIELD

The present disclosure relates to thin-film resistor (TFR) modules formed in integrated circuit (IC) devices, and more particularly to a TFR module including a TFR element formed in a metal cup structure.

BACKGROUND

With more features being packed into individual semiconductor chips, there is an increasing need to fit large numbers of passive components, such as resistors, into the relevant integrated circuits. Some resistors can be created through ion implantation and diffusion, such as poly resistors. However, such resistors typically have high variations in resistance value, and may also have resistance values that change drastically as a function of temperature. A developing technique for constructing integrated resistors, called Thin-Film Resistors (TFRs), typically improves integrated resistor performance. TFRs are often formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example.

Constructing a TFR module in an integrated circuit typically involves multiple additional photomask (mask) layers, e.g., as compared with the background/baseline fabrication process for the relevant IC device. As used herein, a "TFR module" may include a TFR element (e.g., a TFR film element), TFR heads, and certain associated structures, for example conductive contacts providing electrical contact to the TFR heads. For example, building a typical TFR module may add three mask layers to the background/baseline fabrication process, including: (1) a first added mask layer for forming the TFR heads, a second added mask layer for forming the TFR element, and a third added mask layer for forming TFR vias providing conductive contacts to the TFR heads. Each additional mask layer adds cost to the respective manufacturing process.

There is a need for improved TFR modules for integrated circuits, and methods of construction. For example, there is a need for constructing TFR modules using fewer or no additional mask layers added, e.g., as compared with a background/baseline IC fabrication process, e.g., to reduce cost and manufacturing time. As another example, there is a need in some applications for a TFR module with improved temperature coefficient of resistance (TCR) performance.

SUMMARY

A TFR module may include a TFR element formed in a metal cup structure. The TFR element may be spaced apart from (and insulated from) the metal cup structure by a dielectric liner region. The metal cup structure may include a laterally-extending metal cup base and multiple metal cup sidewalls extending upwardly from the laterally-extending metal cup base. The dielectric liner region may be formed in an opening defined by the metal cup structure, and the TFR element may be formed in an opening defined by the dielectric liner region, so that the TFR element is insulated from the metal cup structure by the dielectric liner region.

The TFR element may include a laterally-extending TFR element base, and multiple TFR element sidewalls (for example, one or two pairs of sidewalls) extending upwardly from the laterally-extending TFR element base. A pair of TFR heads may be respectively electrically connected to one pair of TFR element sidewalls, e.g., to a first pair of TFR element sidewalls extending upwardly from a first pair of opposite sides of the laterally-extending TFR element base. In some examples a second pair of TFR element sidewalls (e.g., extending laterally between the pair of TFR heads) may be reduced, e.g., by removing at least a partial vertical height of the second pair of TFR element sidewalls. Reducing the pair of sidewalls extending laterally between the pair of TFR heads may reduce a variability of the TCR (Temperature Coefficient of r-Resistance) of the TFR module (referred to herein as the "TFR TCR"), e.g., by reducing a dependence of the TFR TCR on the lateral width of the TFR element.

In some examples, the TFR module may optionally include a metal cup structure contact electrically connected to the metal cup structure and spaced apart from the pair of TFR heads. The metal cup structure contact and the TFR heads may be formed in a common metal layer, e.g., an aluminum interconnect layer. In some examples the metal cup structure contact defines a closed-loop perimeter (in a horizontal plane) extending around the pair of TFR heads. In some examples the metal cup structure contact may be electrically grounded, which may reduce interference noise that can affect the operation of the TFR module.

In some examples, the TFR module may be constructed without adding any photomask operations to the background/baseline fabrication process for the relevant IC device. In some examples, the TFR module may be constructed concurrently with elements of an IC component structure, e.g., interconnect elements or structures for contacting a transistor component or other active element. For example, the metal cup structure may be formed concurrently with interconnect vias or IC component contacts, e.g., by depositing tungsten or other conformal metal into respective openings formed in a dielectric region. As another example, the TFR heads (and optional metal cup structure contact) may be formed in a metal interconnect element, thus utilizing existing photomask operations of the background/baseline fabrication process for the relevant IC device.

In some examples, the TFR module may be constructed at any depth in an IC device. For example, the TFR module may be constructed between any two metal interconnect layers, between an active region and a metal-1 interconnect layer, or between a shallow trench isolation (STI) field oxide region and a metal-1 interconnect layer.

One aspect provides a TFR including a metal cup structure including (a) a laterally-extending metal cup base and (b) multiple metal cup sidewalls extending upwardly from the laterally-extending metal cup base; a dielectric liner region formed in an opening defined by the metal cup structure; a TFR element formed in an opening defined by the dielectric liner region, wherein the TFR element is insulated from the metal cup structure by the dielectric liner region; and a pair of TFR heads electrically connected to the TFR element.

In some examples, the TFR element includes (a) a laterally-extending TFR element base and (b) multiple TFR element sidewalls extending upwardly from the laterally-extending TFR element base.

In some examples, the multiple TFR element sidewalls extending upwardly from the laterally-extending TFR element base include (a) a first pair of TFR element sidewalls extending upwardly from a first pair of opposite sides of the laterally-extending TFR element base, and (b) a second pair of TFR element sidewalls extending upwardly from a second pair of opposite sides of the laterally-extending TFR element base. A vertical height of the first pair of TFR element sidewalls may be greater than a vertical height of a portion of the second pair of TFR element sidewalls.

In some examples, the multiple TFR element sidewalls extending upwardly from the laterally-extending TFR element base includes one pair of TFR element sidewalls extending upwardly from two opposite sides of the laterally-extending TFR element base.

In some examples, the TFR module includes at least one metal cup structure contact laterally spaced apart from the pair of TFR heads and electrically connected to the metal cup structure, wherein the at least one metal cup structure contact and the pair of TFR heads are formed in a common metal layer.

In some examples, the at least one metal cup structure contact defines a closed-loop perimeter in a horizontal plane.

In some examples, the TFR element includes (a) a laterally-extending TFR element base and (b) a pair of TFR element sidewalls extending upwardly from the laterally-extending TFR element base, and the pair of TFR heads are electrically connected to the pair of TFR element sidewalls, and thereby electrically connected to the TFR element.

In some examples, the dielectric liner region comprises silicon oxide or silicon nitride.

Another aspect provides a device includes an integrated circuit (IC) structure and a TFR module. The IC structure includes a lower IC structure element, at least one IC structure contact formed in a dielectric region and electrically connected to the lower IC structure element, and an upper IC structure element formed in a metal layer and electrically connected to the at least one IC structure contact. The TFR module includes a metal cup structure formed in the dielectric region, the metal cup structure including (a) a laterally-extending metal cup base and (b) multiple metal cup sidewalls extending upwardly from the laterally-extending metal cup base, a dielectric liner region formed in an opening defined by the metal cup structure, a TFR element formed in an opening defined by the dielectric liner region, wherein the TFR element is insulated from the metal cup structure by the dielectric liner region, and a pair of TFR heads formed in the metal layer and electrically connected to the TFR element. The metal cup structure and the at least one IC structure contact may be formed from a common conformal metal deposition (e.g., comprising tungsten).

In some examples, the TFR element includes (a) a laterally-extending TFR element base and (b) multiple TFR element sidewalls extending upwardly from the laterally-extending TFR element base.

In some examples, the multiple TFR element sidewalls extending upwardly from the laterally-extending TFR element base include (a) a first pair of TFR element sidewalls extending upwardly from a first pair of opposite sides of the laterally-extending TFR element base, and (b) a second pair of TFR element sidewalls extending upwardly from a second pair of opposite sides of the laterally-extending TFR element base. The vertical height of the first pair of TFR element sidewalls may be greater than a vertical height of a portion of the second pair of TFR element sidewalls.

In some examples, the multiple TFR element sidewalls extending upwardly from the laterally-extending TFR element base includes a pair of TFR element sidewalls extending upwardly from two opposite sides of the laterally-extending TFR element base.

In some examples, the metal cup structure is formed on a TFR module base formed in a metal interconnect layer.

In some examples, the metal cup structure is formed on a salicided polysilicon structure.

In some examples, the metal cup structure is formed on a shallow trench isolation (STI) field oxide layer.

Another aspect provides a method for manufacturing a TFR module. The method includes forming a tub opening in a dielectric region; depositing a conformal metal over the dielectric region and extending into the tub opening to form a metal cup structure in the tub opening; depositing a dielectric liner over the conformal metal and extending into an opening defined by the metal cup structure; depositing a TFR layer over the dielectric liner extending down into an opening defined by the dielectric liner to form a TFR element cup structure; and performing a planarization process to remove upper portions of the conformal metal, dielectric liner, and TFR layer. A remaining portion of the TFR layer defines a TFR element located within the metal cup structure and including (a) a laterally-extending TFR element base and (b) multiple TFR element sidewalls extending upwardly from the laterally-extending TFR element base. The TFR element is electrically insulated from the metal cup structure by the dielectric liner. The method also includes forming a pair of TFR heads electrically connected to the TFR element.

In some examples, after the planarization process, a remaining portion of the dielectric liner defines a dielectric liner region separating the TFR element from the metal cup structure.

In some examples, the method includes depositing a TFR cap layer over the TFR layer and extending down into an opening defined by the TFR element cup structure, wherein the planarization process removes an upper portion of the TFR cap layer, wherein a remaining portion of the TFR cap layer defines a TFR cap region over the TFR element.

In some examples, the multiple TFR element sidewalls include a pair of TFR element sidewalls extending upwardly from a first pair of opposite sides of the laterally-extending TFR element base, and the method includes forming the pair of TFR heads in a metal layer over the TFR element, wherein the pair of TFR heads are electrically connected to the pair of TFR element sidewalls.

In some examples, the multiple TFR element sidewalls include (a) a first pair of TFR element sidewalls extending upwardly from a first pair of opposite sides of the laterally-extending TFR element base, and (b) a second pair of TFR element sidewalls extending upwardly from a second pair of opposite sides of the laterally-extending TFR element base, and the method includes removing at least a partial height of the second pair of TFR element sidewalls, and forming the pair of TFR heads electrically connected to the first pair of TFR element sidewalls.

In some examples, the method includes performing a metal etch to both (a) remove the at least partial height of the second pair of TFR element sidewalls and (b) form the pair of TFR heads electrically connected to the first pair of TFR element sidewalls.

In some examples, the method includes forming a metal layer including (a) the pair of TFR heads electrically connected to the TFR element and (b) at least one metal cup structure contact laterally spaced apart from the pair of TFR heads and electrically connected to the metal cup structure.

In some examples, the method includes concurrently forming the tub opening and an interconnect via opening in the dielectric region, depositing the conformal metal over the dielectric region and extending into the tub opening to form the metal cup structure in the tub opening and extending into the interconnect via opening to form an interconnect via in the interconnect via opening, and forming a metal layer including (a) the pair of TFR heads electrically connected to the TFR element and (b) an interconnect element electrically connected to the interconnect via.

BRIEF DESCRIPTION OF THE DRAWINGS

Example aspects of the present disclosure are described below in conjunction with the figures, in which:

FIGS. 3A-3J show an example method of forming the example IC structure shown in FIGS. 2A-2B, including the example TFR module and example interconnect structure.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
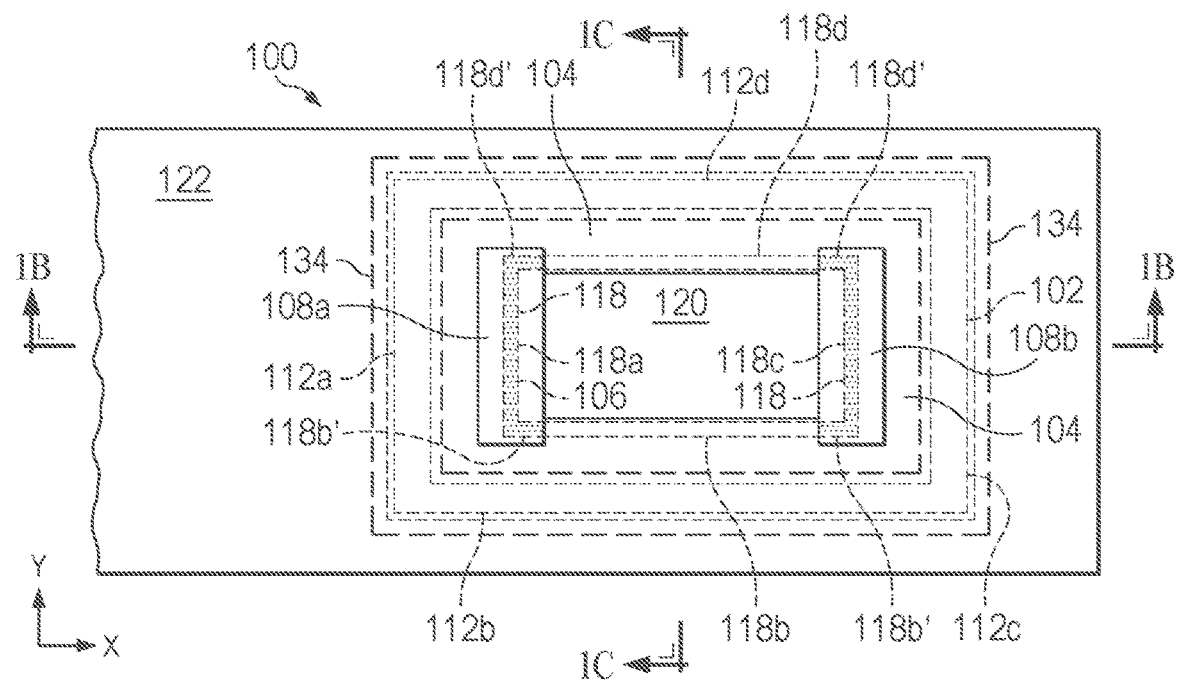
FIG. 1A is a top down view and FIGS. 1B and 1C are two side cross-sectional views of an example TFR module.
Figure 1B:
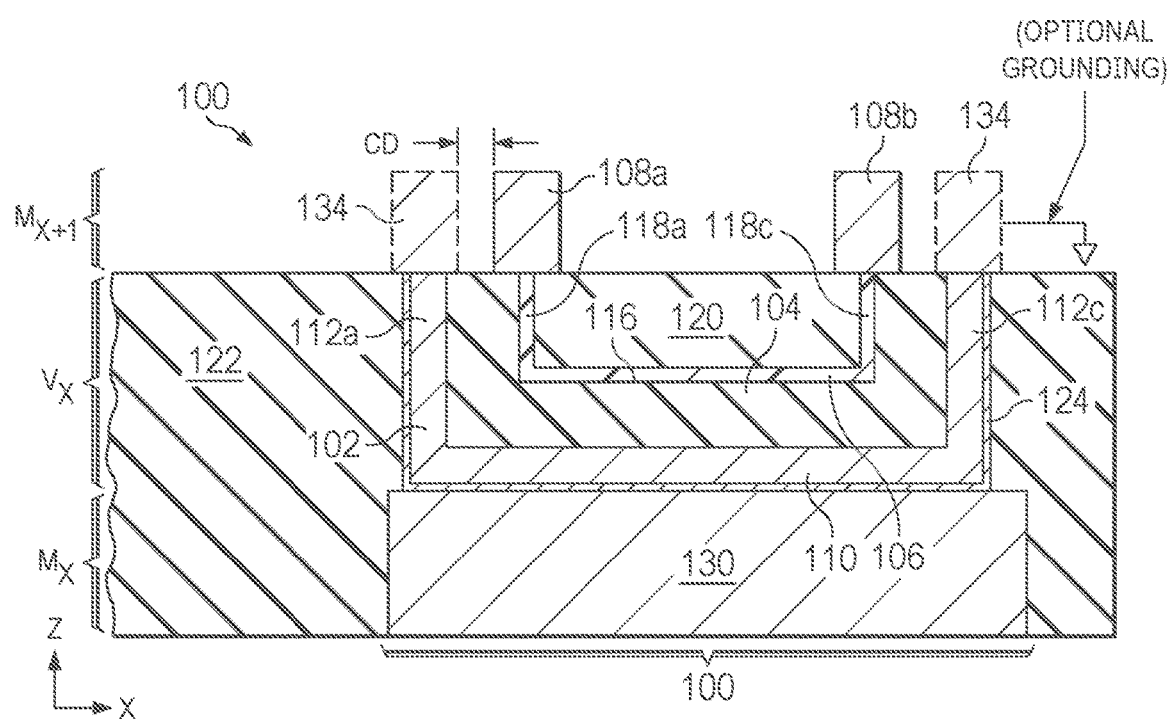
Figure 1C:
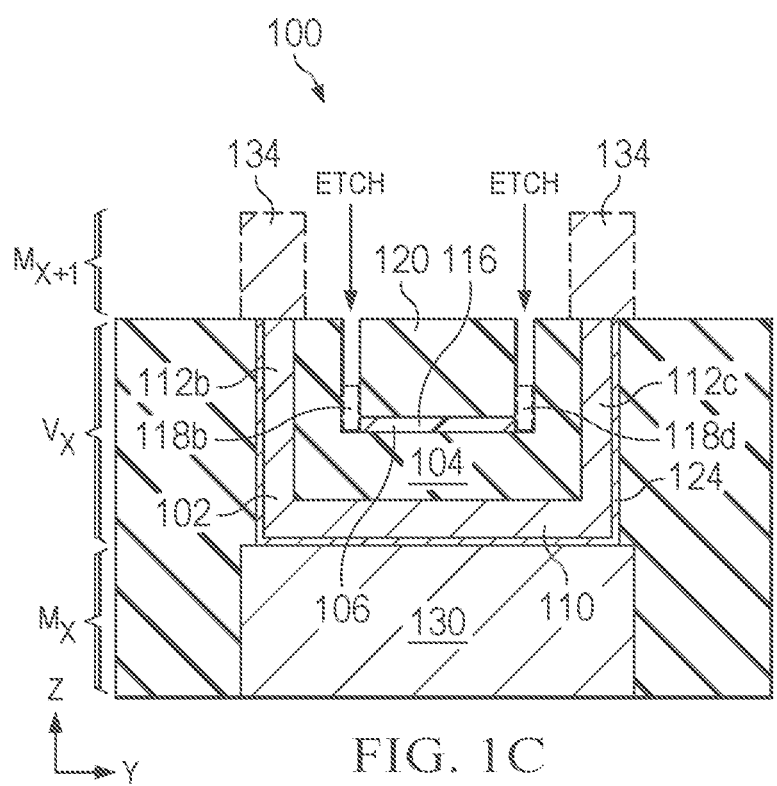

FIGS. 1A-1C show an example TFR module 100 according to the present disclosure. In particular, FIG. 1A shows a top view of TFR module 100, FIG. 1B shows a first side cross-sectional view through cut line 1B-1B shown in FIG. 1A, and FIG. 1C shows a second side cross-sectional view through cut line 1C-1C shown in FIG. 1A. As shown, TFR module 100 includes a metal cup structure 102, a dielectric liner region 104 formed in an opening defined by the metal cup structure 102, a TFR element 106 formed in an opening defined by the dielectric liner region 104, and a pair of TFR heads 108a and 108b electrically connected to the TFR element 106. The metal cup structure 102 includes a laterally-extending metal cup base 110 and multiple metal cup sidewalls 112a-112d extending upwardly from the laterally-extending metal cup base 110. As shown in FIG. 1A, the metal cup sidewalls 112a-112d define a closed-loop rectangular perimeter in the x-y plane.

The TFR element 106 is physically separated from the metal cup structure 102 by the dielectric liner region 104, and thereby electrically insulates the TFR element 106 from the metal cup structure 102. In some examples, dielectric liner region 104 comprises silicon oxide or silicon nitride.

A TFR cap region 120 may be formed over the TFR element 106. The TFR cap region 120 may comprise silicon nitride, silicon oxide, or other suitable material to protect the underlying TFR element 106 from certain fabrication processes, for example a chemical mechanical planarization (CMP) process (e.g., as discussed below with reference to FIGS. 3F and 3G) and/or a metal etch process (e.g., as discussed below with reference to FIGS. 3H-3J).

In the illustrated example, the TFR element 106 includes a laterally-extending TFR element base 116 and multiple TFR element sidewalls 118 extending upwardly from the laterally-extending TFR element base, for example from opposite lateral sides of the laterally-extending TFR element base. In some examples, TFR element 106 includes (a) a first pair of TFR element sidewalls 118a and 118c extending upwardly from a first pair of opposite sides of the laterally-extending TFR element base 116 and (b) a second pair of TFR element sidewalls 118b and 118d extending upwardly from a second pair of opposite sides of the laterally-extending TFR element base 116, where the second pair of opposite side are orthogonal to the first pair of opposite sides. In some examples, the second pair of TFR element sidewalls 118b and 118d may be reduced, e.g., to improve a TCR performance of the TFR module 100, as discussed below. As used herein, "reducing" the second pair of TFR element sidewalls 118b and 118d may include partially or completely removing a vertical (z-direction) height of each TFR element sidewall 118b and 118d, along at least a partial lateral length (in the x-direction) of each TFR element sidewall 118b and 118d. As discussed below, in some examples, TFR element sidewalls 118b and 118d may respectively contain a partial portion aligned below TFR heads 108a and 108b, indicated in FIG. 1A as TFR element sidewall portions 118b' and 118d' in FIG. 1A, which may remain intact after an etch that partially or completely removes the other portions of TFR element sidewalls 118b and 118d (i.e., portions of TFR element sidewalls 118b and 118d not aligned below TFR head 108a or 108b).

In some examples, the second pair of TFR element sidewalls 118b and 118d may be partially removed, e.g., by a metal etch process, such that a vertical height of the second pair of TFR element sidewalls 118b and 118d (e.g., except TFR element sidewall portions 118b' and 118d') is less than a vertical height (z-direction) of the first pair of TFR element sidewalls 118a and 118c. In other examples, the second pair of TFR element sidewalls 118b and 118d (e.g., except TFR element sidewall portions 118b' and 118d') may be completely removed, e.g., by an etch process, such that TFR element 106 includes only the first pair of TFR element sidewalls 118a and 118c (and in some examples the unremoved TFR element sidewall portions 118b' and 118d'). FIGS. 1A and 1C collectively show an example of (optional) vertically-shortened TFR element sidewalls 118b and 118d, indicated by dashed lines, although in other examples the TFR element sidewalls 118b and 118d may be completely removed, as discussed above.

In some examples the TFR element sidewalls 118b and 118d may be reduced, e.g., as described above, by a metal etch process used to form TFR heads 108a and 108b (and optional metal cup structure contact(s) 134, discussed below).

As mentioned above, reducing the second pair of TFR element sidewalls 118b and 118d may improve a TCR performance of the TFR module 100. It is known that ridges or other protrusions extending from a TFR element, e.g., between the two TFR heads, may provide unwanted effects regarding the TCR of the relevant TFR module. For example, sidewalls 118b and 118d extending upwardly from the TFR element may laterally-extending TFR element base 116 may influence the TCR of TFR module 100 as a function of a lateral width of the TFR element 106 in the y-direction. Thus, in some examples, reducing the second pair of TFR element sidewalls 118b and 118d may reduce a variability of the TCR of the TFR module 100, e.g., by reducing a dependence of the TCR on the width of the TFR element 106 in the y-direction.

As shown in FIGS. 1A and 1B, the pair of TFR heads 108a and 108b may be formed on respective upper surfaces of the pair of TFR element sidewalls 118a and 118c, such that TFR heads 108a and 108b are electrically connected to TFR element sidewalls 118a and 118c, and thereby electrically connected to the TFR element 106.

Figure 4:
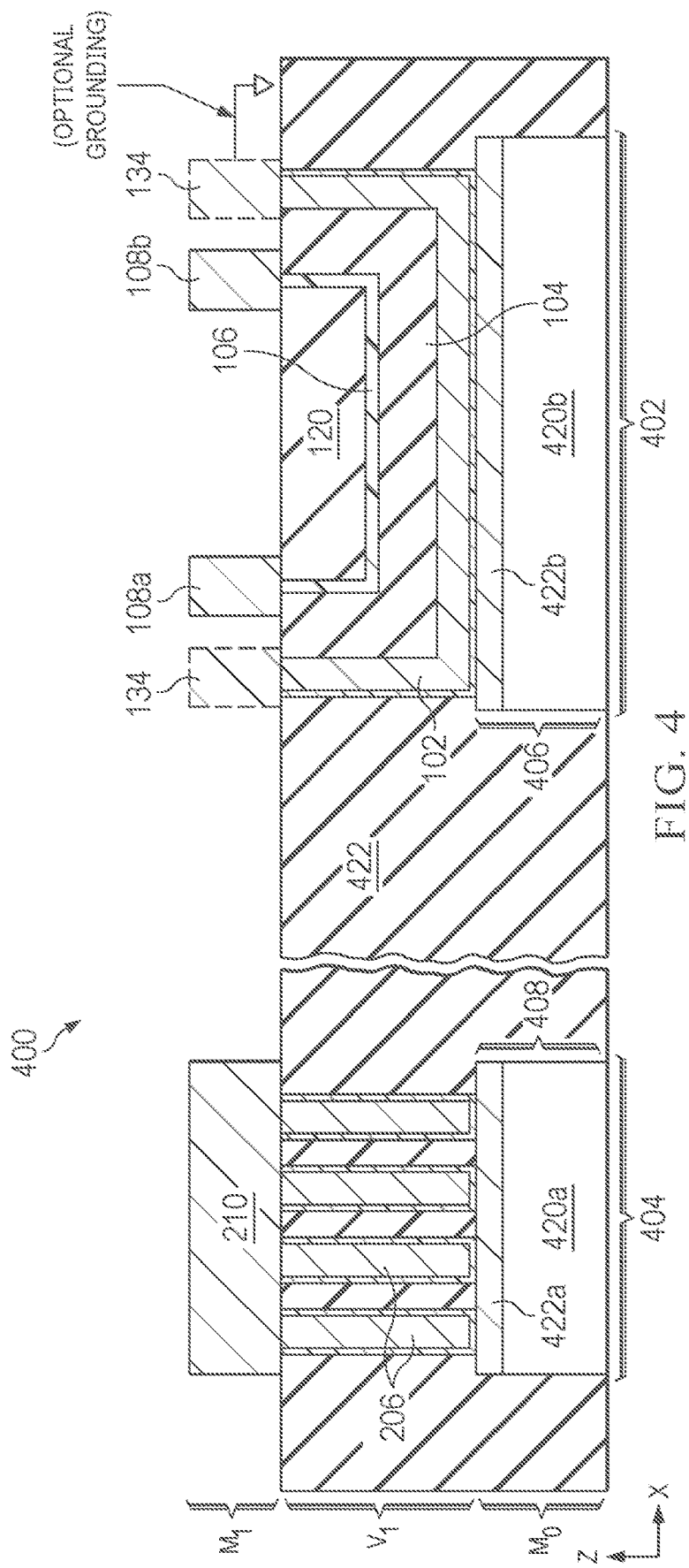
FIG. 4 is a side cross-sectional view showing an example IC structure including an example TFR module and an example interconnect structure formed on a silicided polysilicon layer.
Figure 5:
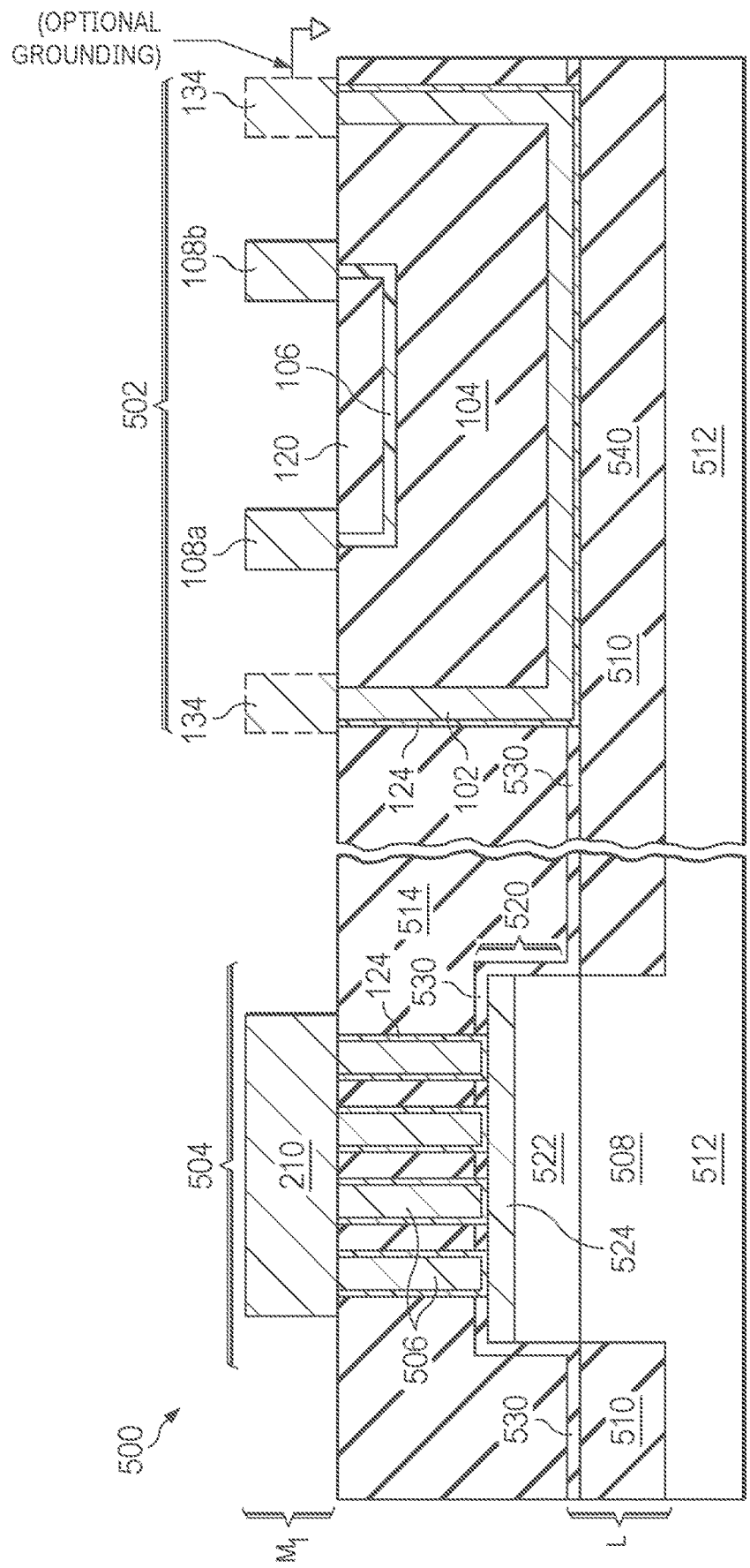
FIG. 5 is a side cross-sectional view showing an example IC structure including an example TFR module constructed in a pre-metal dielectric (PMD) region between a field oxide and metal-1 layer.

In some examples, the metal cup structure 102 is formed over a liner (or "glue layer") 124, e.g., comprising TiN with a thickness in the range of 50 Å-200 Å. In some examples, the metal cup structure 102 (including liner 124) is formed on a TFR module base 130. For example, e.g., as shown in FIGS. 3A-3J discussed below, the TFR module base 130 may comprise a metal element formed in a metal interconnect layer. As another examples, e.g., as shown in FIG. 4 discussed below, the TFR module base 130 may comprise a silicided polysilicon structure including a polysilicon region having a layer or region of metal silicide formed thereon. In other examples, e.g., as shown in FIG. 5 discussed below, the TFR module base 130 may be formed on a shallow trench isolation (STI) oxide layer.

In some examples, TFR module 100 optionally includes at least one metal cup structure contact 134 electrically connected to the metal cup structure 102, and laterally spaced apart from the pair of TFR heads 108a and 108b. In some examples, the metal cup structure contact 134 and the pair of TFR heads 108a and 108b are formed in a common (i.e., the same) metal layer, e.g., a metal interconnect layer comprising aluminum or other suitable metal.

In the illustrated example, e.g., as shown in FIG. 1A, TFR element 106 includes a metal cup structure contact 134 that defines a closed-loop rectangular perimeter (in the horizontal x-y plane) extending around the pair of TFR heads 108a and 108b. In some examples, e.g., as indicted in FIG. 1B, metal cup structure contact 134 may be grounded by suitable conductive elements connected to metal cup structure contact 134, which may reduce interference noise that can affect the operation of TFR module 100.

In some examples, TFR module 100 may be constructed without adding any photomask operations to the background integrated circuit fabrication process, as discussed below in more detail.

Figure 2A:
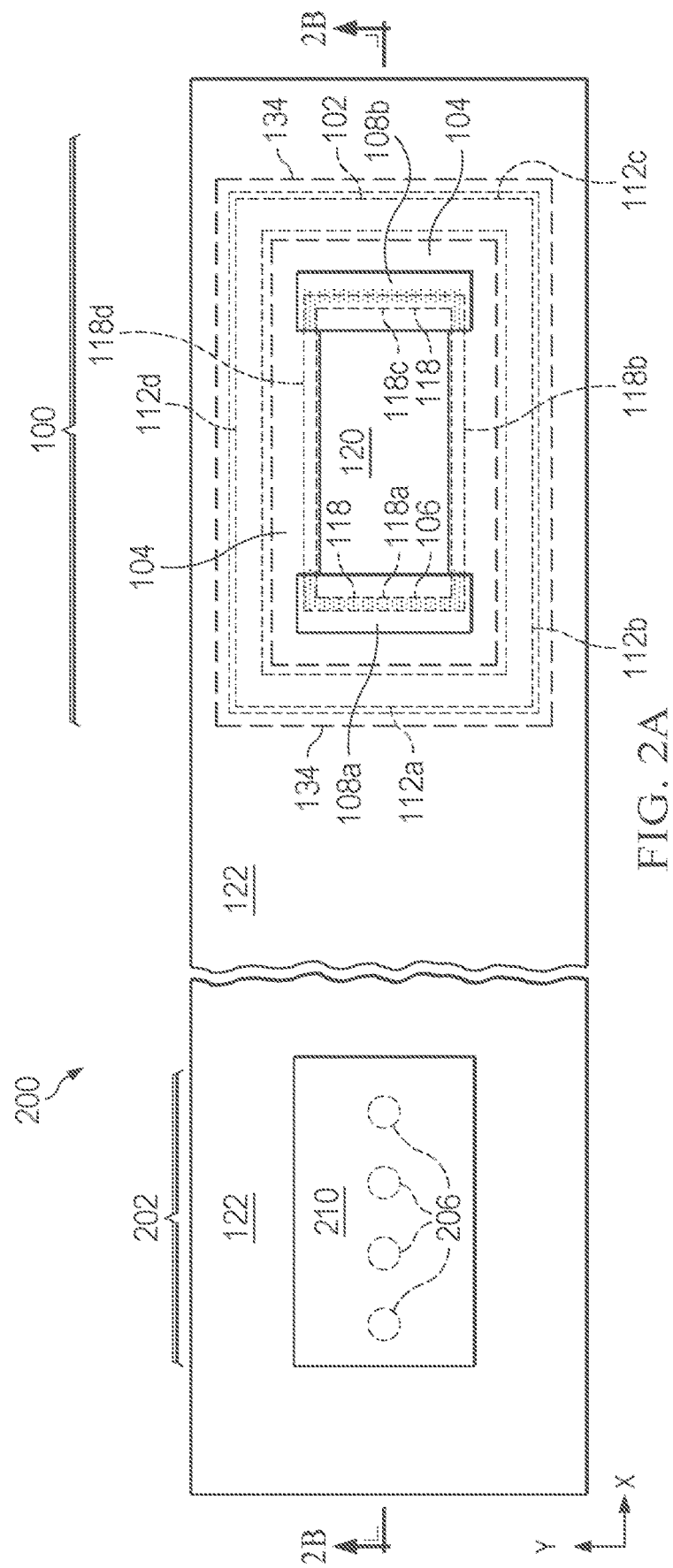
FIG. 2A is a top view and FIG. 2B is a side cross-sectional view showing an example IC structure including the example TFR module of FIGS. 1A-1C and an example interconnect structure, which may be formed concurrently, according to one example.
Figure 2B:
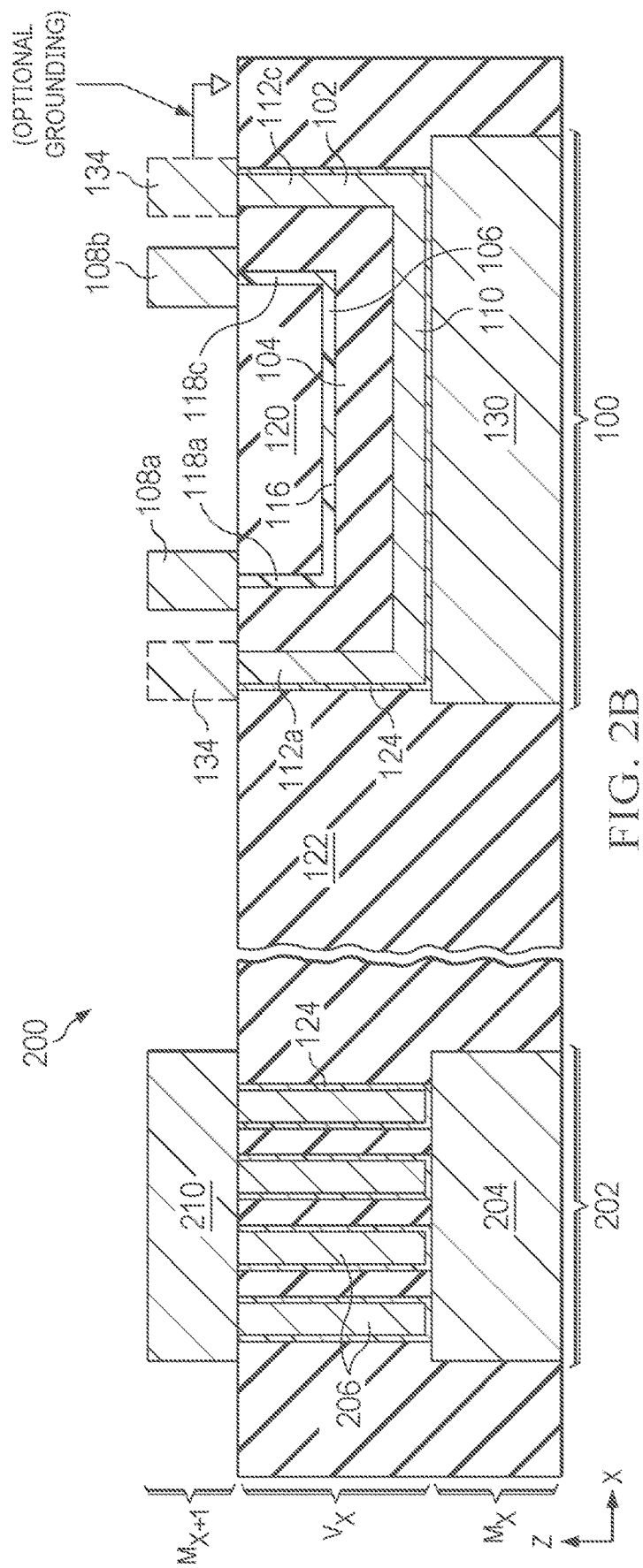

FIGS. 2A and 2B show an example IC device 200 including the TFR module 100 shown in FIGS. 1A-1B and an example IC structure 202 formed concurrently, according to one example. In particular, FIG. 2A shows a top view of the example IC device 200, and FIG. 2B shows a side cross-sectional view of the example IC device 200 through cut line 2B-2B shown in FIG. 2A.

As mentioned above, the TFR module 100 may be constructed without adding any photomask operations to the background/baseline fabrication process for forming the IC structure 202.

As discussed above, TFR module 100 includes metal cup structure 102, dielectric liner region 104, TFR element 106 formed in the metal cup structure 102 and insulated from the metal cup structure 102 by the dielectric liner region 104, a pair of TFR heads 108a and 108b, and optionally a metal cup structure contact 134. A TFR cap region 120 may be formed over the TFR element 106. The metal cup structure 102 includes laterally-extending metal cup base 110 and multiple metal cup sidewalls 112a-112d extending upwardly from the laterally-extending metal cup base 110 and defining a closed-loop rectangular perimeter in the x-y plane. As discussed above, the metal cup structure 102 may be formed over a liner 124, e.g., comprising TiN, and may be formed on a TFR module base 130 or other suitable structure (e.g., on a STI field oxide layer).

The TFR element 106 includes laterally-extending TFR element base 116 and multiple TFR element sidewalls 118 extending upwardly from the laterally-extending TFR element base. As discussed above, TFR element 106 includes the first pair of TFR element sidewalls 118a and 118c extending upwardly from the first pair of opposite sides of the laterally-extending TFR element base 116 and may optionally include the second pair of TFR element sidewalls 118b and 118d extending upwardly from the second pair of opposite sides of the laterally-extending TFR element base 116, which second pair of opposite sides are orthogonal to the first pair of opposite sides. As discussed above, in some examples the second pair of TFR element sidewalls 118b and 118d may be reduced (e.g., by removing a partially or full height of TFR element sidewalls 118b and 118d), which may reduce a variability of the TFR TCR.

As shown in FIG. 2B, IC structure 202 may comprise a lower IC structure element 204 formed in lower metal layer $M_x$, at least one IC structure contact 206 electrically connected to the lower IC structure element 204, and an upper IC structure element 210 formed in upper metal layer $M_{x+1}$ and electrically connected to the at least one IC structure contact 206. In this example, lower IC structure element 204 comprises a lower interconnect element 204 formed in lower metal layer $M_x$, the at least one IC structure contact 206 comprise interconnect vias 206 formed in via layer $V_x$ (e.g., by depositing a conformal via material, e.g., tungsten, into respective interconnect via openings) and electrically connected to the lower interconnect element 204, and the upper IC structure element 210 comprises an upper interconnect element 210 formed in upper metal layer $M_{x+1}$ and electrically connected to the interconnect vias 206.

Each of the lower interconnect element 204 and upper interconnect element 210 may comprise a wire or other laterally elongated structure, or a discrete pad (e.g., having a rectangular or substantially rectangular shape from a top view), or any other suitable shape and structure.

The lower interconnect element 204 and the TFR module base 130 may be formed concurrently in lower metal layer $M_x$. The upper interconnect element 210, TFR heads 108a and 108b, and (optional) metal cup structure contact 134 may be formed concurrently in upper metal layer $M_{x+1}$. The metal cup structure 102, dielectric liner region 104, TFR element 106, and TFR cap 120 may be formed in via layer $V_x$ between the lower metal layer $M_x$ and upper metal layer $M_{x+1}$, e.g., using a damascene process as discussed below with respect to FIGS. 3A-3H. As discussed below with respect to FIG. 3B, interconnect vias 206 and metal cup structure 102 may be formed concurrently by deposition of a conformal via material, e.g., tungsten, into respective openings in the dielectric region 122.

As used herein, a "metal layer," for example in the context of lower metal layer $M_x$ and upper metal layer $M_{x+1}$, may comprise any metal or metalized layer or layers, including (a) a metal interconnect layer, e.g., comprising copper, aluminum or other metal deposited by a subtractive patterning process (e.g., deposition, patterning, and etching of a metal layer) or using a damascene process, or (b) a silicided polysilicon layer including a number of polysilicon regions each having a layer or region of metal silicide formed thereon, for example. For example, in some examples the lower metal layer $M_x$ may be a silicided polysilicon layer and the upper metal layer $M_{x+1}$ may comprise a first metal interconnect layer, often referred to as metal-1. In such examples, x=0 such that the lower metal layer $M_x=M_0$ and the upper metal layer $M_{x+1}=M_1$ (i.e., metal-1).

FIGS. 3A-3J show an example method of forming the example IC structure 200 shown in FIG. 2, including example TFR module 100 and example interconnect structure 202. In other examples, the interconnect structure 202 may be optional, such that TFR module 100 may be formed by the process described below without the elements of interconnect structure 202.

Figure 3A:
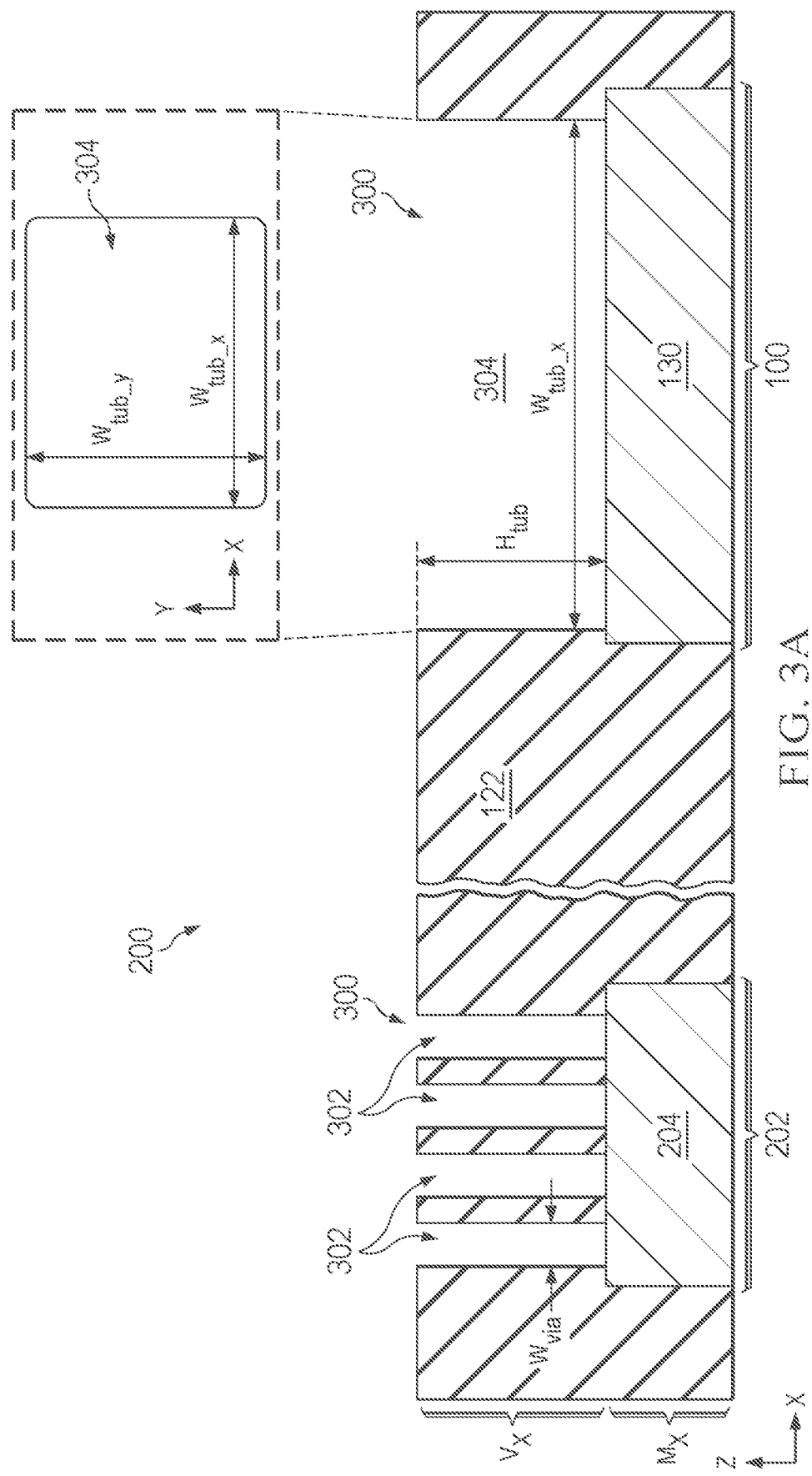

As shown in FIG. 3A, the lower interconnect element 204 and the TFR module base 130 are formed in the lower metal layer $M_x$. In this example, the lower metal layer $M_x$ may comprise a metal interconnect layer, wherein the lower interconnect element 204 and TFR module base 130 are respectively formed as metal elements (e.g., aluminum elements). In another example, e.g., as shown in FIG. 4 discussed below, the lower metal layer $M_x$ may comprise a silicided polysilicon layer, wherein the lower interconnect element 204 and TFR module base 130 respectively comprise a silicide region formed on a respective polysilicon structure.

Dielectric region 122 (e.g., an Inter Metal Dielectrics (IMD) region or Poly Metal Dielectrics (PMD) region) is formed over the lower interconnect element 204 and the TFR module base 130, which lower interconnect element 204 and the TFR module base 130 were formed in lower metal layer $M_x$. Dielectric region 122 may include one or more dielectric materials, e.g., silicon oxide, PSG (phosphosilicate glass), or FSG (fluorine doped glass), or a combination thereof.

Via layer openings 300, including interconnect via openings 302 and a tub opening 304, may be patterned (using a photomask) and etched in the dielectric region 122. Via layer openings 300 may be formed using a plasma etch or other suitable etch, followed by a resist strip or other suitable process to remove remaining portions of photoresist material. The etch process to form via layer openings 300 may be a selective etch that stops on lower interconnect element 204 and TFR module base 130 (e.g., comprising aluminum or other metal). Thus, TFR module base 130 may act as an etch stop for forming tub opening 304.

Interconnect via openings 302 may be via openings having a width (or diameter or Critical Dimension (CD)) $W_{via}$ in both the x-direction and y-direction in the range of 0.1-0.5 μm, for example.

In contrast, tub opening 304 may have a substantially larger width in the x-direction ($W_{tub\_x}$) and/or y-direction ($W_{tub\_y}$) than interconnect via openings 302. The shape and dimensions of the tub opening 304 may be selected based on various parameters, e.g., for effective manufacturing of the TFR module 100 (e.g., effective formation of the metal cup structure 102, dielectric liner region 104, TFR element 106, and TFR cap region 120 in the tub opening 304) and/or for desired performance characteristics of the resulting TFR module 100. In one example, e.g., as shown in FIG. 3A, the tub opening 304 may have a square or rectangular shape from the top view.

As noted above, a width of tub opening 304 in the x-direction ($W_{tub\_x}$), y-direction ($W_{tub\_y}$), or both the x-direction and y-direction ($W_{tub\_x}$ and $W_{tub\_y}$) may be substantially larger than the width $W_{via}$ of interconnect via openings 302 in the x-direction, y-direction, or both the x-direction and y-direction. For example, in some examples, width $W_{tub\_x}$ and $W_{tub\_y}$ of tub opening 304 are respectively at least twice as large as the width $W_{via}$ of interconnect via openings 302. In particular examples, width $W_{tub\_x}$ and $W_{tub\_y}$ of tub opening 304 are respectively at least five time as large or at least 10 times as large as the width $W_{via}$ of interconnect via openings 302. In some examples, $W_{tub\_x}$ and $W_{tub\_y}$ are respectively in the range of 1-100 μm.

Further, tub opening 304 may be formed with a height-to-width aspect ratio of less than or equal to 1.0 in both the x-direction and y-direction, e.g., to allow effective filling of the tub opening 304 by conformal materials. For example, tub opening 304 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of tub opening 304 by various materials to form metal cup structure 102, dielectric liner region 104, TFR element 106, and TFR cap layer 120 in the tub opening 304. For example, tub opening 304 may be formed with aspect ratios $H_{tub}/W_{tub\_x}$ and $H_{tub}/W_{tub\_y}$ respectively in the range of 0.1-1.0, or more particularly in the range of 0.5-1.0.

Figure 3B:
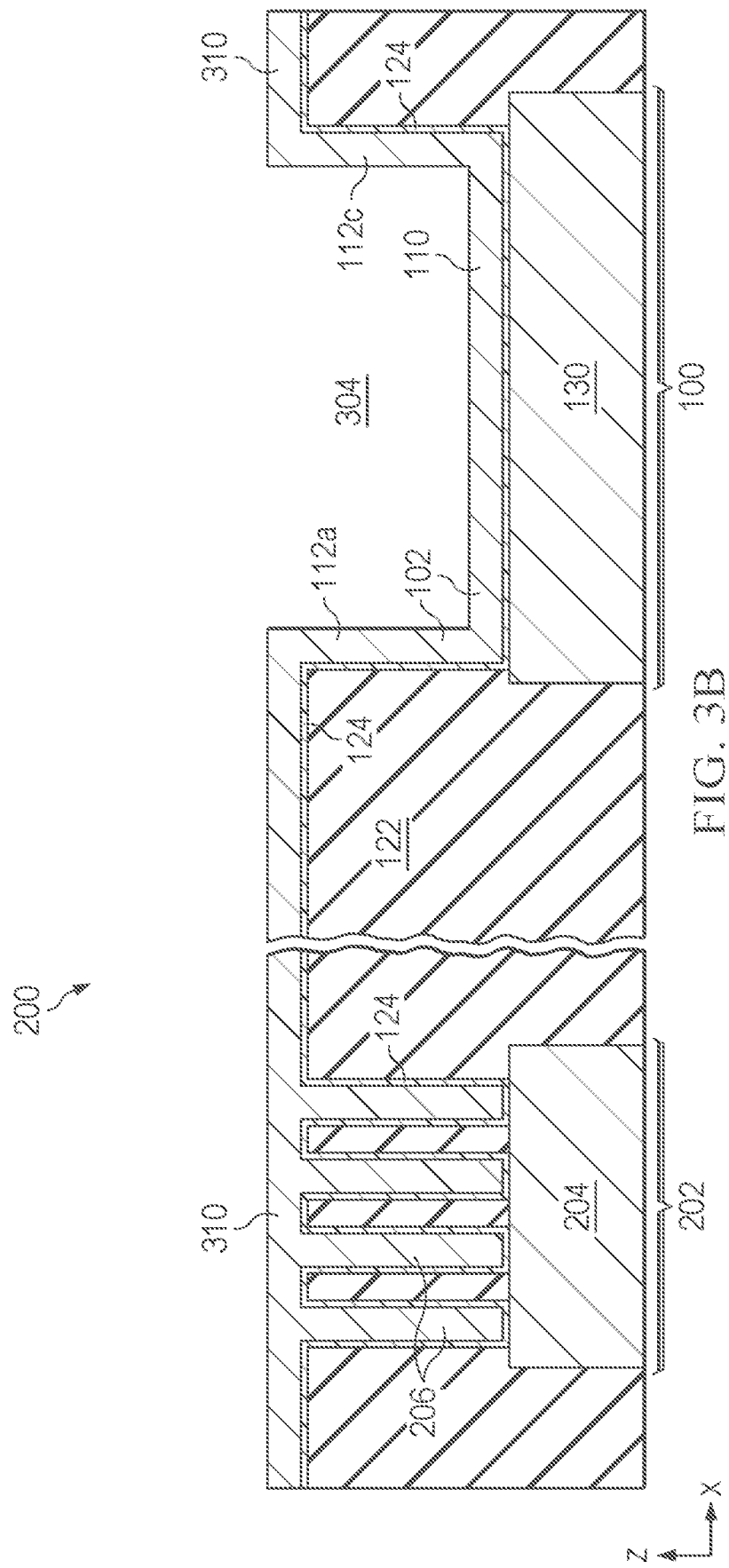

Next, as shown in FIG. 3B, the liner 124, e.g., comprising TiN with a thickness in the range of 50 Å-200 Å, may be deposited over the structure and extends into respective via layer openings 300. A conformal metal 310 is deposited over the liner 124 and extends into respective via layer openings 300 to (a) fill interconnect via openings 302 to form respective interconnect vias 206, and (b) form the metal cup structure 102 including laterally-extending metal cup base 110 and metal cup sidewalls 112a-112d extending upwardly from lateral perimeter edges of the laterally-extending metal cup base 110 and defining a closed-loop rectangular perimeter in the x-y plane. Metal cup sidewalls 112a and 112c are shown in the cross-sectional view of FIG. 3B, while metal cup sidewalls 112b and 112d are out of the plane of FIG. 3B and thus not shown.

In one example, the conformal metal 310 comprises tungsten deposited with a thickness in the range of 1000 Å-5000 Å. In other examples, the conformal metal 310 may comprise Co, TiN, or other conformal metal. The conformal metal 310 may be deposited by a conformal chemical vapor deposition (CVD) process or other suitable deposition process.

Figure 3C:
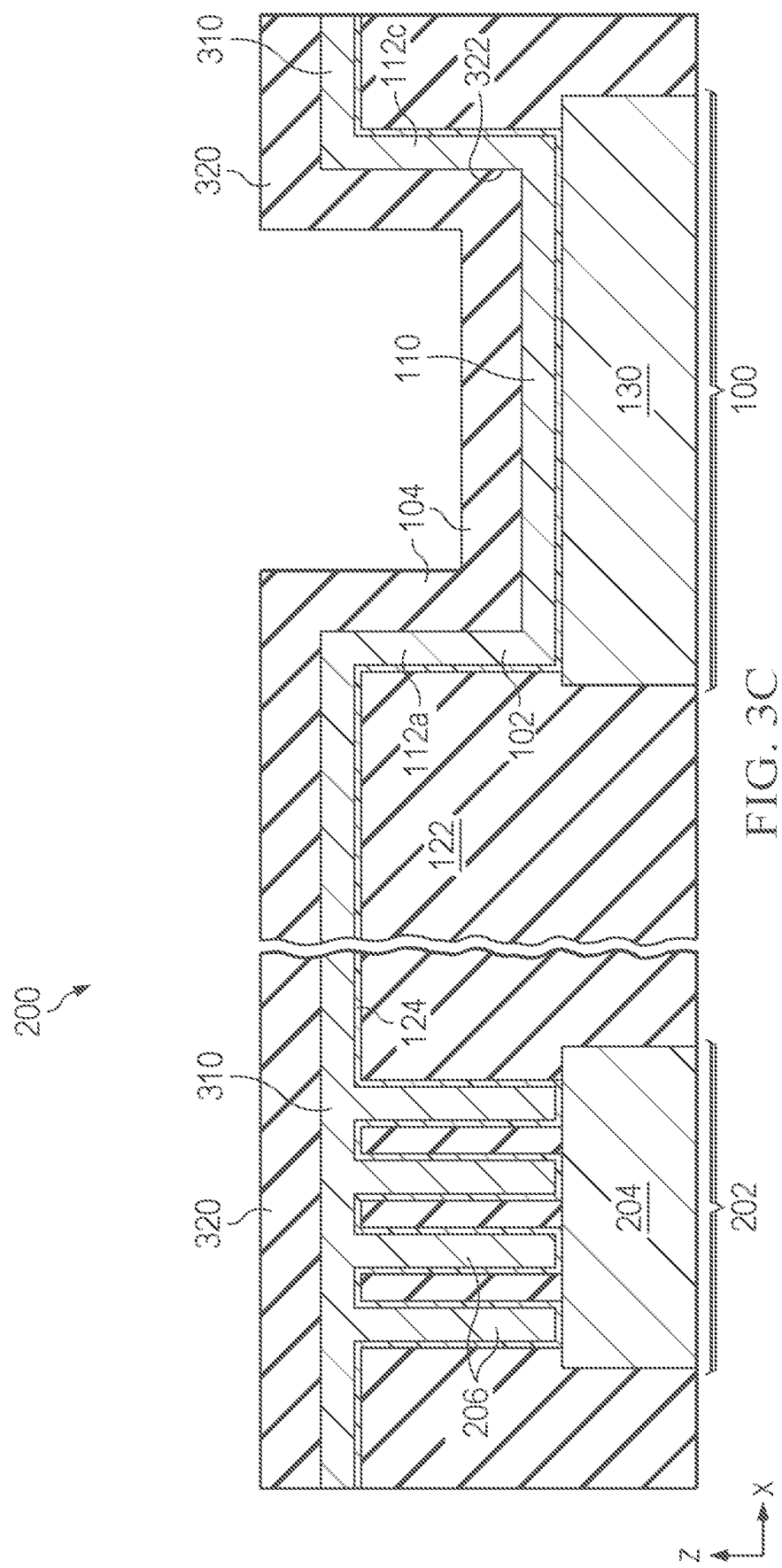

Next, as shown in FIG. 3C, a dielectric liner 320 is deposited over the conformal metal 310 and extends into an opening 322 defined by the metal cup structure 102, to form the cup-shaped dielectric liner region 104 in the opening 322. In some examples, the dielectric liner 320 comprises silicon oxide, silicon nitride, or other conformal dielectric material, and may deposited with a thickness $T_{DL}$ in the range of 2000 Å-5000 Å. In some examples the dielectric liner 320 may be deposited by a Plasma Enhanced Chemical Vapor Deposition (PECVD) process.

Figure 3D:
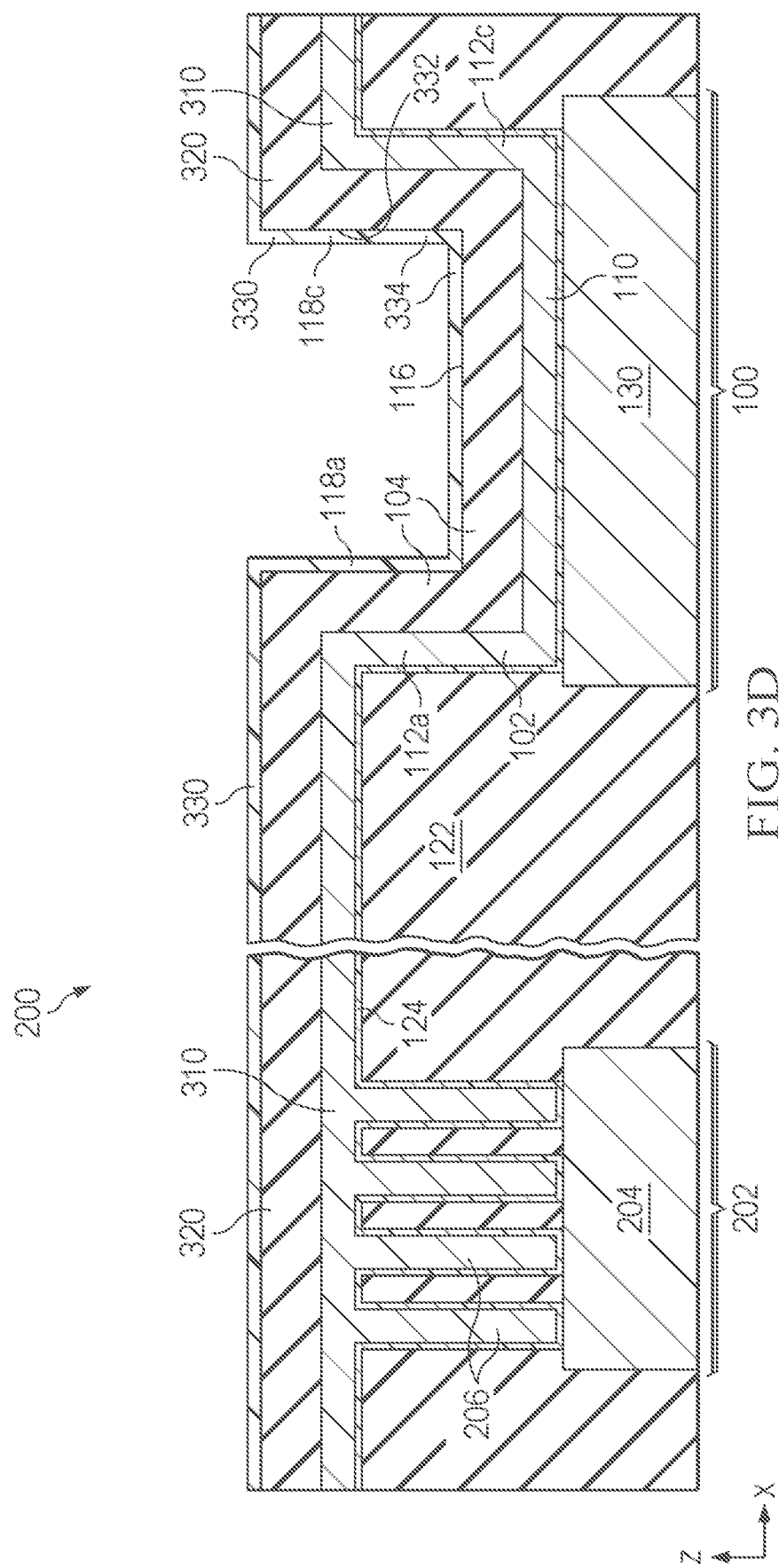

Next, as shown in FIG. 3D, a TFR layer (or film) 330 is deposited over the dielectric liner 320 and extends down into an opening 332 by the cup-shaped dielectric liner region 104 to form a cup-shaped TFR layer structure 334 including (a) laterally-extending TFR element base 116 and (b) TFR element sidewalls 118a-118d extending upwardly from the laterally-extending TFR element base 116. In this example, the TFR element sidewalls 118a-118d extend upwardly from respective lateral perimeter edges of the laterally-extending TFR element base 116. In some examples, TFR layer 330 comprises SiCCr, SiCr, NiCr, TaN, TiN, or other TFR material, and may be deposited by Physical Vapor Deposition (PVD) with a thickness in the range of 50 Å-1000 Å, for example. In some examples such TFR layer 330 may provide a sheet resistance of about 1 KO/square, e.g., for use in analog applications.

In some examples, the TCR of the TFR layer may be modified or "tuned" to a value closer to zero, for example to a value in the range of −100 ppm/° C. to +100 ppm/° C., in the range of −50 ppm/° C. to +50 ppm/° C., or in the range of −10 ppm/° C. to +10 ppm/° C., to thereby reduce the temperature-sensitivity of the performance of completed TFR module 100. For example, in examples in which the TFR element 106 is constructed in a PMD region prior to forming a metal-1 layer (e.g., the examples shown in FIGS. 4-6), the TFR layer 330 may be annealed (thereby tuning the TCR value of TFR layer 330 closer to zero) by heating up TFR layer 330 in a temperature controlled process at an elevated temperature, for example in the range of 250° C. to 600° C.

Figure 3E:
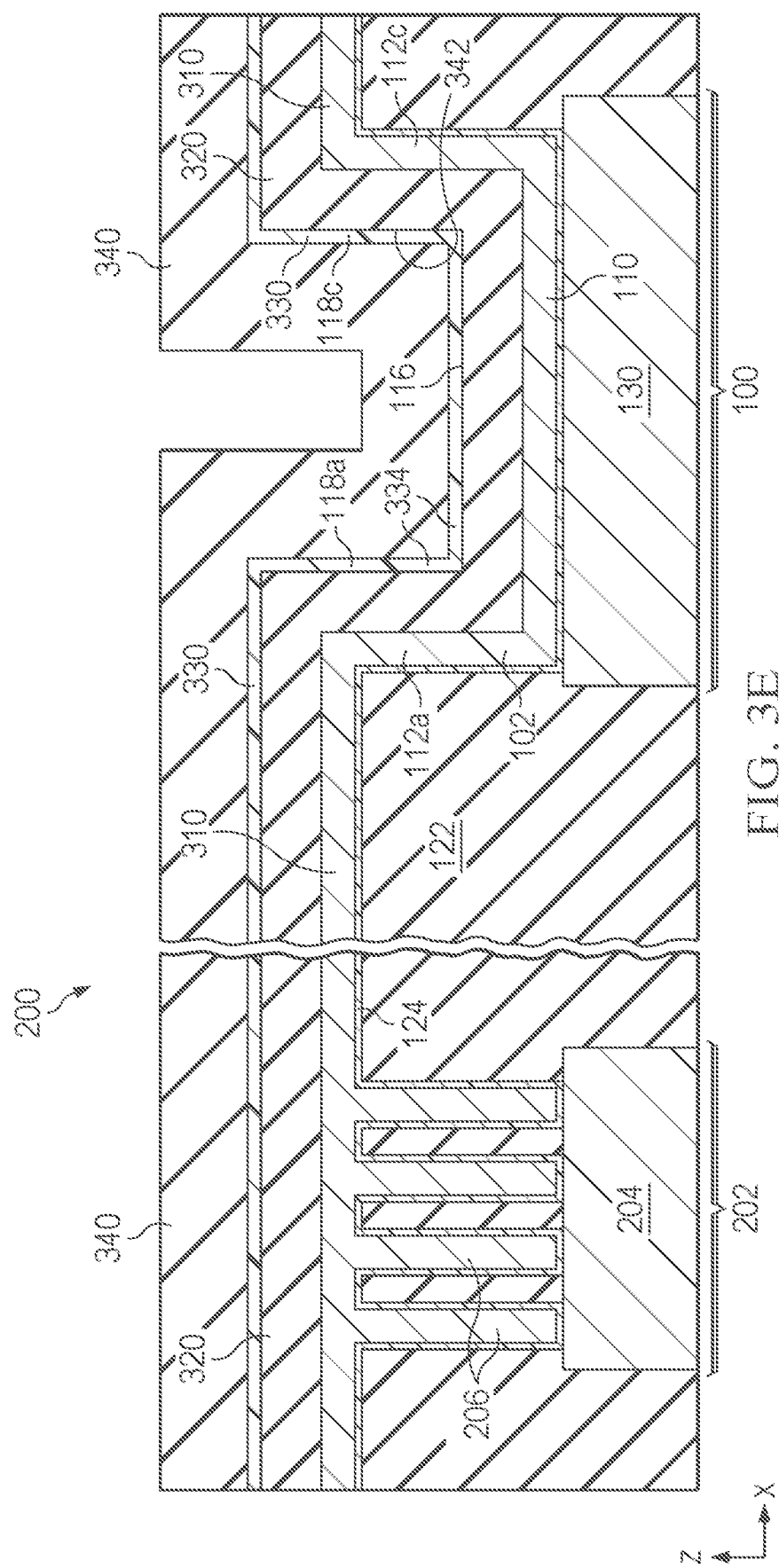

Next, as shown in FIG. 3E, a TFR cap layer 340 is deposited over the TFR layer 330 and extends into and fills an opening 342 defined by the cup-shaped TFR layer structure 334. In some examples, TFR cap layer 340 may comprise silicon nitride, silicon oxide, or other suitable material to protect the underlying TFR layer 330 (in particular the cup-shaped TFR layer structure 334) during subsequent processes, e.g., the CMP process discussed below with reference to FIGS. 3F and 3G and the metal etch discussed below with reference to FIGS. 3H-3J.

Figure 3F:
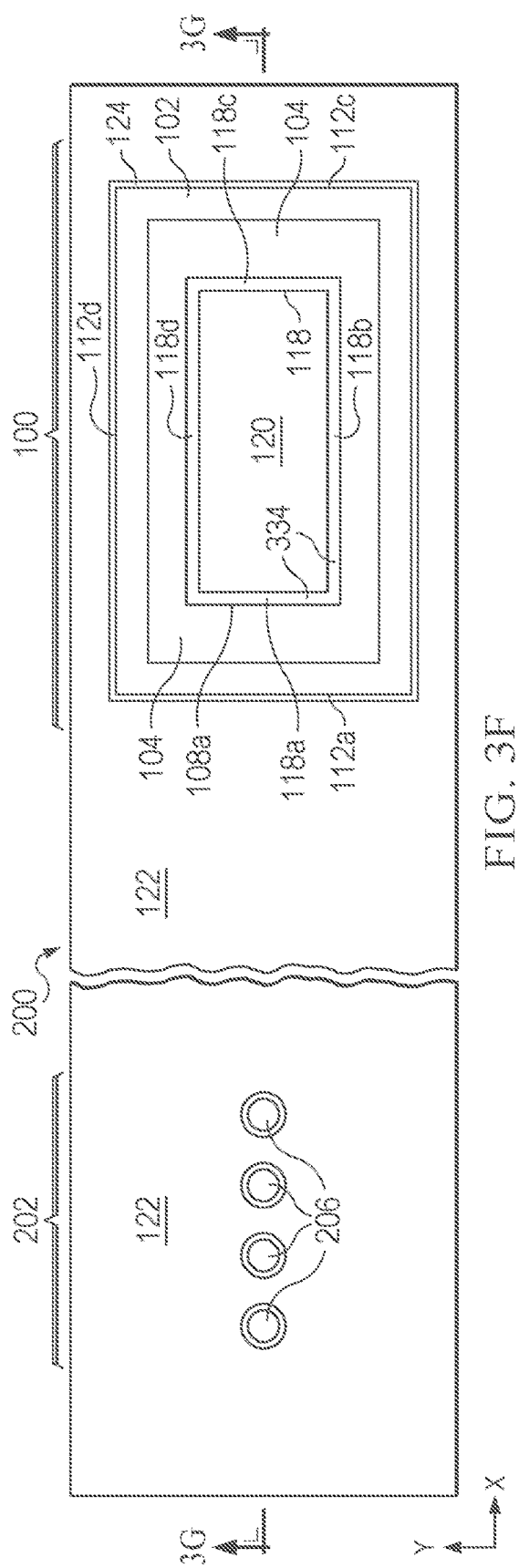
Figure 3G:
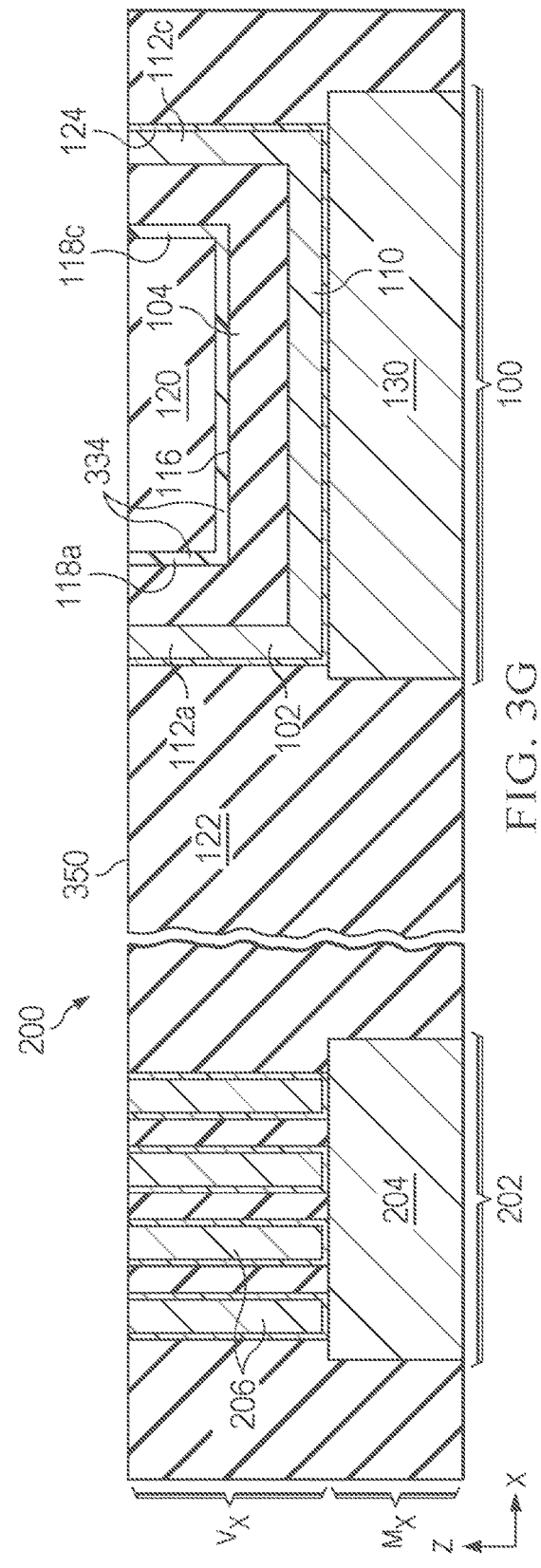

Next, as shown in FIGS. 3F and 3G, a planarization process, e.g., chemical mechanical planarization (CMP) process, is performed to remove upper portions of the TFR cap layer 340, TFR layer 330, dielectric liner 320, conformal metal 310, and liner 124. FIG. 3F shows a top view of the resulting structure after the planarization process, and FIG. 3G shows a side cross-sectional view taking through line 3G-3G shown in FIG. 3F. The planarization process forms a planarized upper surface 350 of the via layer $V_x$. The dielectric liner 320 may protect portions of the underlying TFR layer, including the laterally-extending TFR element base 116, from the planarization process. A portion of the dielectric liner 320 remaining after the planarization process defines the dielectric liner region 120.

Figure 3I:
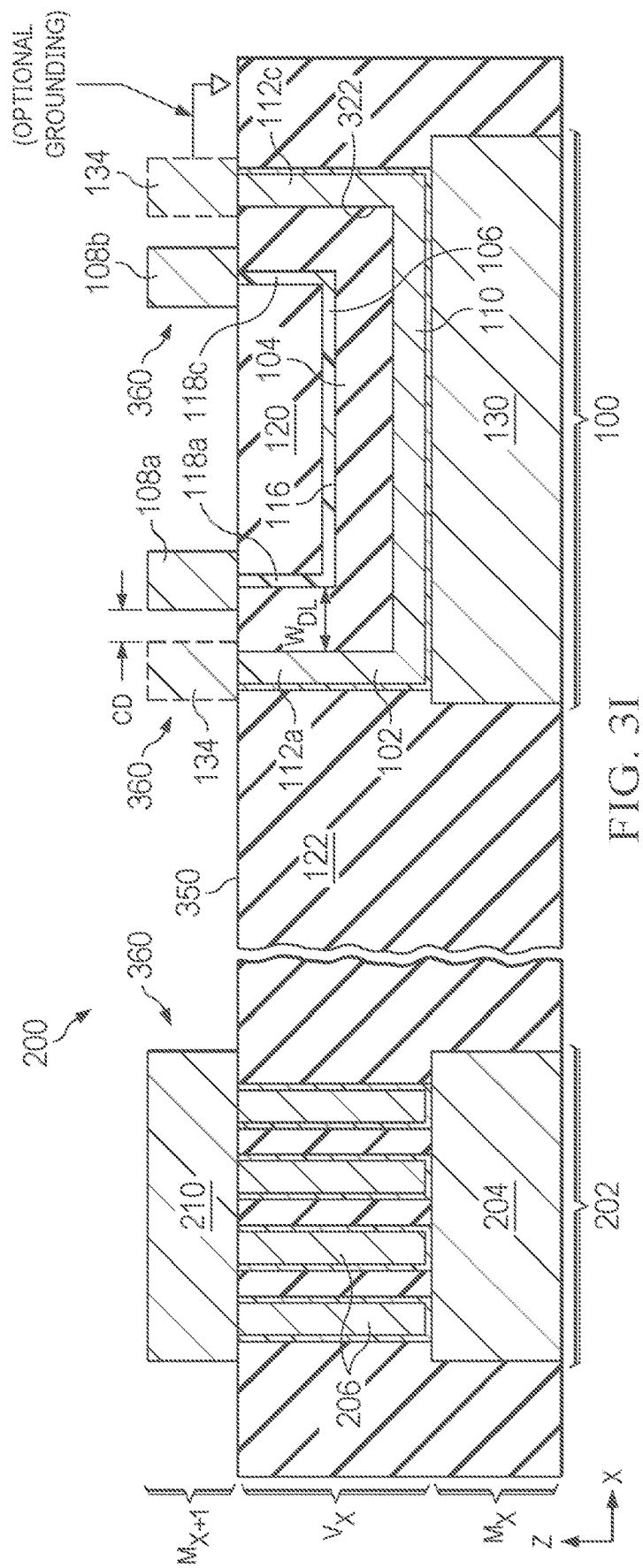
Figure 3J:
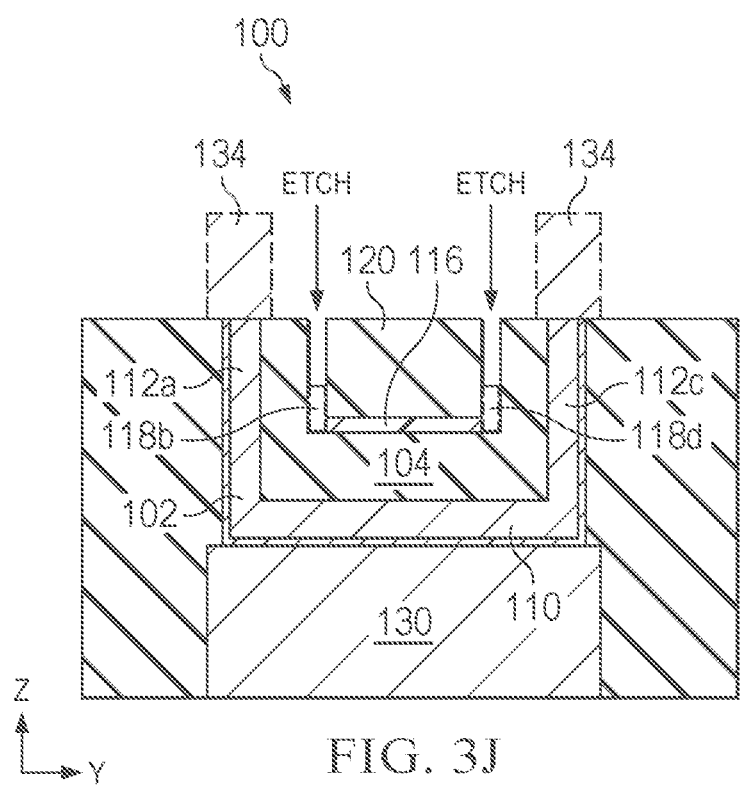

Next, as shown in FIGS. 3H, 3I, and 3J, an upper metal layer ($M_{x+1}$ layer) is formed on the planarized upper surface 350 of the via layer $V_x$. FIG. 3H shows a top view of the resulting structure after formation of the upper metal layer, FIG. 3I shows a side cross-sectional view through line 3I-3I shown in FIG. 3H, and FIG. 3J shows a side cross-sectional view through line 3J-3J shown in FIG. 3H. Various metal elements 360 may be formed in the upper metal layer $M_{x+1}$ including (a) the upper interconnect element 210 electrically connected (e.g., by direct contact) to interconnect vias 206, (b) the TFR heads 108a and 108b electrically connected (e.g., by direct contact) to TFR element sidewalls 118a and 118c, respectively, and (c) the optional metal cup structure contact 134 electrically connected (e.g., by direct contact) to the metal cup structure 102, and optionally connected to ground. The upper metal layer $M_{x+1}$ may comprise aluminum or other suitable metal.

In some examples, metal elements 360 may be formed by depositing a metal (e.g., aluminum) on the planarized upper surface 350, forming and patterning a photomask over the deposited metal, and performing a metal etch to remove portions of the deposited metal uncovered by the patterned photomask. In some examples, the metal etch may continue (downwardly) beyond the upper metal layer $M_{x+1}$ to reduce the TFR element sidewalls 118b and 118d, e.g., by removing at least a partial vertical height of the TFR element sidewalls 118b and 118d unprotected by overlying TFR heads 108a and 108b. In some examples these unprotected portions of TFR element sidewalls 118b and 118d (i.e., not aligned below TFR head 108a or 108b) are partially removed by the metal etch, leaving vertically-shortened TFR element sidewalls 118b and 118d, e.g., as shown in FIG. 3J. In other examples, the unprotected portions of TFR element sidewalls 118b and 118d are completely removed by the metal etch, such that the resulting TFR element 106 includes only one pair of TFR element sidewalls 118a and 118c extending upwardly from the laterally-extending TFR element base 116, and in some examples protected portions of TFR element sidewalls 118b' and 118d' (i.e., portions of TFR element sidewalls 118b and 118d aligned below TFR heads 108a and 108b). The dielectric liner region 120 may protect the underlying laterally-extending TFR element base 116 from the etch.

As discussed above regarding FIGS. 1A-1C, reducing the second pair of TFR element sidewalls 118b and 118d may improve the TCR performance of the TFR element 106, e.g., by reducing its dependence of the width of the TFR element 106 in the y-direction. Thus, the TCR performance of TFR module 100 may be improved by both (a) performing an anneal as discussed above regarding FIG. 3D and (b) reducing the second pair of TFR element sidewalls 118b and 118d, e.g., during the metal etch used to form upper metal layer $M_{x+1}$.

The optional metal cup structure contact 134 may be laterally spaced apart from the pair of TFR heads 108a and 108b. As shown in FIG. 3I, the metal cup structure contact 134 may be spaced apart from the pair of TFR heads 108a and 108b by a minimum lateral spacing (or "critical dimension"—CD) sufficient to avoid electrical shorts, when accounting for dimensional deviations resulting from typical process variations. In some examples, the dielectric liner 320 is deposited with a sufficient thickness (e.g., 2500 Å-5000 Å) to provide a defined minimum lateral width $W_{DL}$. The minimum lateral width $W_{DL}$ may be selected to allow the formation of metal cup structure contact 134 (in contact with underlying metal cup sidewalls 112a-112d) spaced apart from TFR heads 108a and 108b (respectively in contact with underlying TFR element sidewalls 118a and 118c) by at least the minimum lateral spacing CD.

In the illustrated example shown in FIGS. 3H-3I, the metal cup structure contact 134 defines a closed-loop rectangular perimeter (in the horizontal x-y plane) that extends around (e.g., completely around) the TFR heads 108a and 108b. In some examples, as indicted in FIG. 3I, the metal cup structure contact 134 may be grounded by suitable conductive elements connected to metal cup structure contact 134, which may reduce interference noise that can affect the operation of TFR module 100.

FIG. 4 is a side cross-sectional view showing an example IC device 400 including an example TFR module 402 and an example interconnect structure 404 formed on a lower metal layer M₀ comprising a silicided polysilicon layer. TFR module 402 may include metal cup structure 102, dielectric liner region 104, TFR element 106 formed in the metal cup structure 102 and insulated from the metal cup structure 102 by the dielectric liner region 104, a pair of TFR heads 108a and 108b, and optionally a metal cup structure contact 134. A TFR cap region 120 may be formed over the TFR element 106. The metal cup structure 102 may be formed over liner 124, and may be formed on a TFR module base 406.

In this example, a lower interconnect element 408 of the interconnect structure 404 and the TFR module base 406 may respectively comprise a metal silicide region formed on a respective polysilicon region. In particular, the lower interconnect element 408 may comprise a first metal silicide region 422a formed on a first polysilicon region 420a, and the TFR module base 406 may comprise a second metal silicide region 422b formed on a second polysilicon region 420b. In some examples, metal silicide regions 422a and 422b may comprise titanium silicide, cobalt silicide, or nickel silicide. In this example, the metal cup structure 102, dielectric liner region 104, TFR element 106, and TFR cap 120 may be formed in a via layer (or contact layer) V₀ comprising a pre-metal dielectric (PMD) region 422, and the upper interconnect element 210, TFR heads 108a and 108b, and (optional) metal cup structure contact 134 may be formed concurrently in a metal-1 (M₁) interconnect layer, e.g., comprising aluminum. In some examples, PMD region 422 may comprise silicon oxide, phosphosilicate glass (PSG), or Borophosphosilicate Glass (BPSG).

In another embodiment, the TFR module 402 may be formed on a non-silicided polysilicon region. For example, with reference to FIG. 4, the second metal silicide region 422b may be omitted and the metal cup structure 102 of the TFR module 402 may be formed directly on the polysilicon region 420b.

FIG. 5 is a side cross-sectional view showing another example IC device 500 including an example TFR module 502 and an example IC structure 504 formed between (a) a lower layer L comprising an active region 508 and an STI field oxide region 510 and (b) a metal-1 layer M₁. The active region 508 may comprise a doped silicon region formed adjacent the field oxide region 510 over a silicon substrate 512.

The example IC structure 504 includes a lower IC structure element 520, at least one IC structure contact 506 electrically connected to the lower IC structure element 520, and an upper IC structure element 210 formed in the metal-1 layer M₁ and electrically connected to the at least one IC structure contact 506. In this example, the lower IC structure element 520 comprise a silicided polysilicon element formed on the active region 508, the at least one IC structure contact 506 comprises vertically-extending contacts 506 electrically connected to the underlying silicided polysilicon element 520, and the upper IC structure element 210 comprises an interconnect element 210 formed in the metal-1 layer M₁ and electrically connected to the vertically-extending contacts 506. The vertically-extending contacts 506 are formed in a PMD region 514, e.g., comprising silicon oxide, PSG, or BPSG, as described above in relation to interconnect vias 206. The silicided polysilicon element 520 may comprise a metal silicide region 524 (e.g., comprising titanium silicide, cobalt silicide, or nickel silicide) formed on a polysilicon region 522, e.g., a poly gate of a transistor.

TFR module 502 may include metal cup structure 102, dielectric liner region 104, TFR element 106 formed in the metal cup structure 102 and insulated from the metal cup structure 102 by the dielectric liner region 104, a pair of TFR heads 108a and 108b electrically connected to TFR element 106, and optionally a metal cup structure contact 134 electrically connected to metal cup structure 102. A TFR cap region 120 may be formed over the TFR element 106. The metal cup structure 102 may be formed over liner 124.

As shown, the metal cup structure 102 (and liner 124) may be formed directly on the STI field oxide region 510, such that the STI field oxide region 510 defines a TFR module base 540.

In some examples, an optional etch stop layer 530, e.g., comprising silicon nitride with a thickness in the range of 250 Å-750 Å, may be formed over the STI field oxide region 510 and extending over the silicided polysilicon element 520. The optional etch stop layer 530 may control the depth of an etch used to form respective openings in the PMD region 514 for forming the vertically-extending contacts 506 and the metal cup structure 102. In some examples the vertically-extending contacts 506 and metal cup structure 102 may be formed concurrently by depositing tungsten or other conformal metal in the respective openings in the PMD region 514, optionally over a liner 124.

Figure 6:
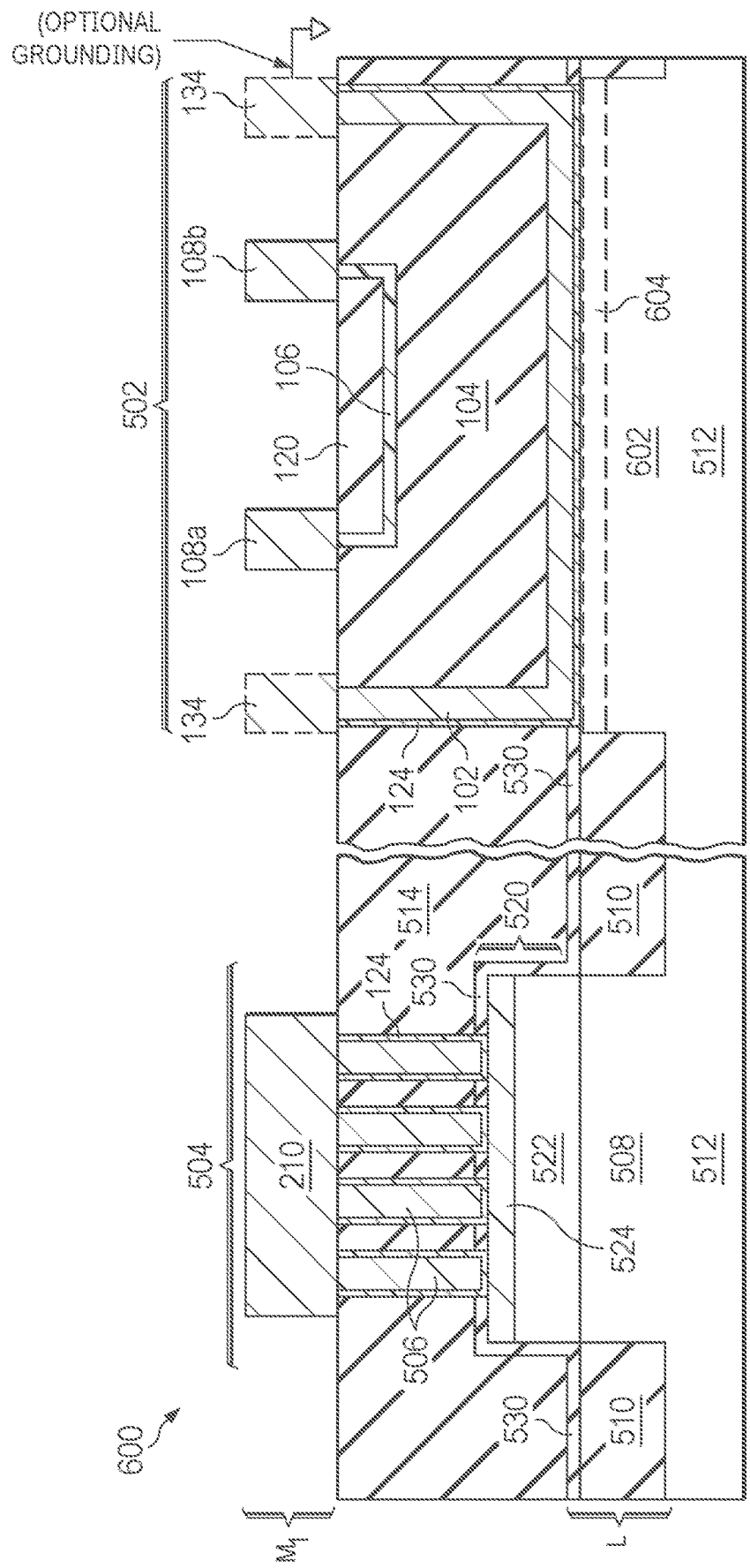
FIG. 6 is a side cross-sectional view showing an example IC structure including an example TFR module constructed in a PMD region between an active region and metal-1 layer.

FIG. 6 is a side cross-sectional view showing an example IC device 600 including the example TFR module 502 and example IC structure 504 from example IC device 500 discussed above. However, in this example the TFR module 502 is formed on an active region 602, e.g., a doped silicon region adjacent STI field oxide region 510. In some examples the active region 602 is silicided, wherein an optional metal silicide region 604 (e.g., comprising titanium silicide, cobalt silicide, or nickel silicide) is formed on the active region 602, and the metal cup structure 102 of the TFR module 502 is formed on the metal silicide region 604. In other examples the active region 602 is non-silicided, and the metal cup structure 102 is formed directly on the active region 602 (e.g., doped silicon region), which thus defines the TFR module base.

Figure 7A:
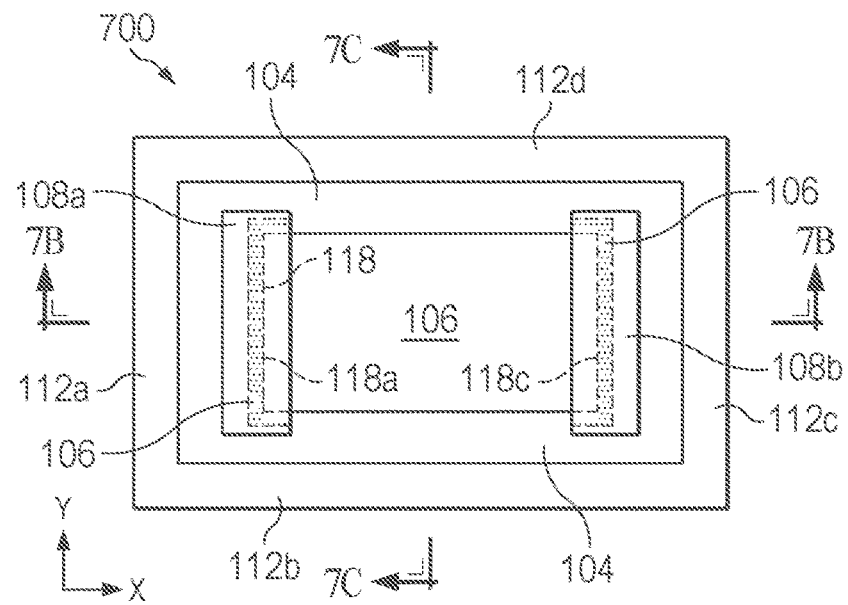
FIG. 7A is a top down view and FIGS. 7B and 7C are two side cross-sectional views of an example TFR module.
Figure 7B:
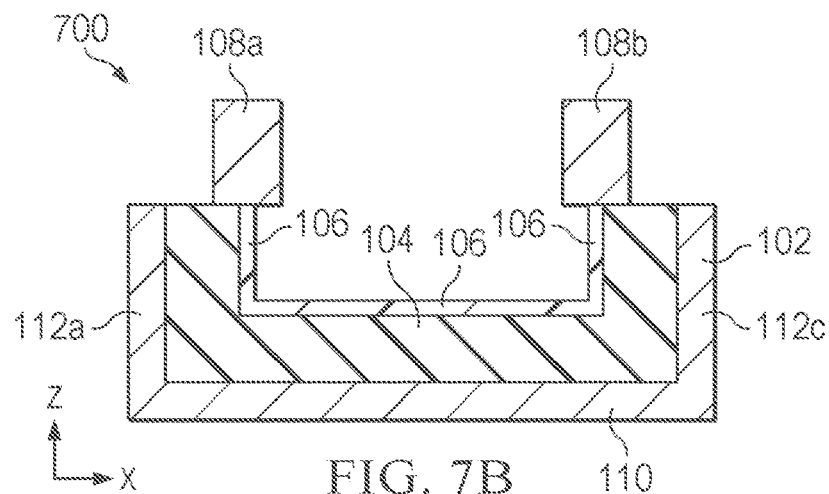
Figure 7C:
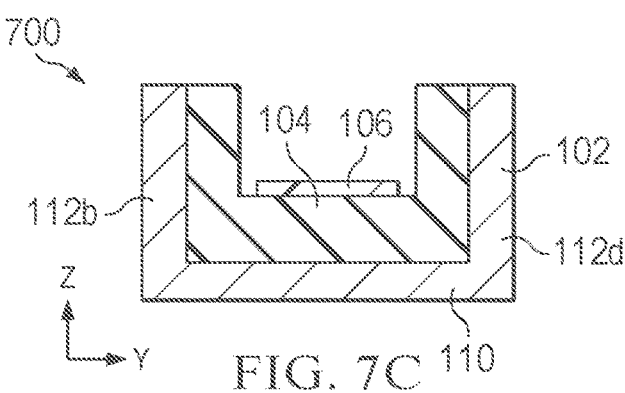

FIG. 7A is a top down view and FIGS. 7B and 7C are two side cross-sectional views of an example TFR module 700. In particular, FIG. 7A shows a top view of TFR module 700, FIG. 7B shows a first side cross-sectional view through cut line 7B-7B shown in FIG. 7A, and FIG. 7C shows a second side cross-sectional view through cut line 7C-7C shown in FIG. 7A. As shown, TFR module 700 includes (a) metal cup structure 102 including laterally-extending metal cup base 110 and multiple metal cup sidewalls 112a-112d extending upwardly from the laterally-extending metal cup base 110, (b) dielectric liner region 104 formed in an opening defined by the metal cup structure 102, (c) TFR element 106 formed in an opening defined by the dielectric liner region 104, wherein the dielectric liner region 104 insulates TFR element 106 from metal cup structure 102, and the pair of TFR heads 108a and 108b electrically connected to TFR element 106.

The invention claimed is:

1. A thin film resistor (TFR) module, comprising:
   a metal cup structure in a dielectric region between a lower metal layer $M_x$ and an upper metal layer $M_{x+1}$, the metal cup structure including (a) a laterally-extending metal cup base and (b) multiple metal cup sidewalls extending upwardly from the laterally-extending metal cup base toward the upper metal layer $M_{x+1}$;
   a dielectric liner region formed in an opening defined by the metal cup structure;

a TFR element formed in an opening defined by the dielectric liner region, wherein the TFR element is insulated from the metal cup structure by the dielectric liner region; and a pair of TFR heads formed in the upper metal layer $M_{x+1}$ and electrically connected to the TFR element.

2. The TFR module of claim 1, wherein the TFR element includes (a) a laterally-extending TFR element base and (b) multiple TFR element sidewalls extending upwardly from the laterally-extending TFR element base.

3. The TFR module of claim 2, wherein the multiple TFR element sidewalls extending upwardly from the laterally-extending TFR element base include:

a first pair of TFR element sidewalls extending upwardly from a first pair of opposite sides of the laterally-extending TFR element base; and a second pair of TFR element sidewalls extending upwardly from a second pair of opposite sides of the laterally-extending TFR element base;

wherein a vertical height of the first pair of TFR element sidewalls is greater than a vertical height of a portion of the second pair of TFR element sidewalls.

4. The TFR module of claim 2, wherein the multiple TFR element sidewalls extending upwardly from the laterally-extending TFR element base includes one pair of TFR element sidewalls extending upwardly from two opposite sides of the laterally-extending TFR element base.

5. The TFR module of claim 1, comprising at least one metal cup structure contact laterally spaced apart from the pair of TFR heads and electrically connected to the metal cup structure;

wherein the at least one metal cup structure contact and the pair of TFR heads are formed in the upper metal layer $M_{x+1}$.

6. The TFR module of claim 5, wherein the at least one metal cup structure contact defines a closed-loop perimeter in a horizontal plane.

7. The TFR module of claim 1, wherein:

the TFR element includes (a) a laterally-extending TFR element base and (b) a pair of TFR element sidewalls extending upwardly from the laterally-extending TFR element base; and the pair of TFR heads are electrically connected to the pair of TFR element sidewalls, and thereby electrically connected to the TFR element.

8. The TFR module of claim 1, wherein the dielectric liner region comprises silicon oxide or silicon nitride.

9. The TFR module of claim 1, comprising a planarized surface defining an upper surface of the metal cup structure, an upper surface of the dielectric liner region, and an upper surface of the TFR element.

10. The TFR module of claim 9, comprising a TFR cap region formed in an opening defined by the TFR element, wherein the planarized surface defines an upper surface of the TFR cap region.

11. The TFR module of claim 1, wherein the metal cup structure surrounds the TFR element in a horizontal plane passing through the metal cup structure and TFR element.

12. A device, comprising:

an integrated circuit (IC) structure, comprising:

a lower IC structure element formed in a lower metal layer $M_x$; and at least one IC structure contact formed in a dielectric region between the lower metal layer $M_x$ and an upper metal layer $M_{x+1}$, the IC structure contact electrically connected to the lower IC structure element; and an upper IC structure element formed in the upper metal layer $M_{x+1}$, the upper IC structure element electrically connected to the at least one IC structure contact; and a thin film resistor (TFR) module comprising:

a metal cup structure formed in the dielectric region between the lower metal layer $M_x$ and upper metal layer $M_{x+1}$, the metal cup structure including (a) a laterally-extending metal cup base and (b) multiple metal cup sidewalls extending upwardly from the laterally-extending metal cup base;

wherein the metal cup structure and the at least one IC structure contact are formed from a conformal metal;

a dielectric liner region formed in an opening defined by the metal cup structure; and a TFR element formed in an opening defined by the dielectric liner region, wherein the TFR element is insulated from the metal cup structure by the dielectric liner region; and a pair of TFR heads formed in the upper metal layer $M_{x+1}$, the pair of TFR heads electrically connected to the TFR element.

13. The device of claim 12, wherein the TFR element includes (a) a laterally-extending TFR element base and (b) multiple TFR element sidewalls extending upwardly from the laterally-extending TFR element base.

14. The device of claim 13, wherein the multiple TFR element sidewalls extending upwardly from the laterally-extending TFR element base include:

a first pair of TFR element sidewalls extending upwardly from a first pair of opposite sides of the laterally-extending TFR element base; and a second pair of TFR element sidewalls extending upwardly from a second pair of opposite sides of the laterally-extending TFR element base;

wherein a vertical height of the first pair of TFR element sidewalls is greater than a vertical height of a portion of the second pair of TFR element sidewalls.

15. The device of claim 13, wherein the multiple TFR element sidewalls extending upwardly from the laterally-extending TFR element base includes a single pair of TFR element sidewalls extending upwardly from two opposite sides of the laterally-extending TFR element base.

16. The device of claim 12, wherein the metal cup structure is formed on a TFR module base formed in a metal interconnect layer.

17. The device of claim 12, wherein the metal cup structure is formed on a salicided polysilicon structure.

18. The device of claim 12, wherein the metal cup structure is formed on a shallow trench isolation (STI) oxide layer.

19. A thin film resistor (TFR) module, comprising:

a metal cup structure including (a) a laterally-extending metal cup base and (b) multiple metal cup sidewalls extending upwardly from the laterally-extending metal cup base;

a dielectric liner region formed in an opening defined by the metal cup structure;

a TFR element formed in an opening defined by the dielectric liner region, wherein the TFR element is insulated from the metal cup structure by the dielectric liner region; and a pair of TFR heads electrically connected to the TFR element;

wherein the metal cup structure surrounds the TFR element in a horizontal plane passing through the metal cup structure and TFR element.

20. The TFR module of claim 19, comprising at least one metal cup structure contact laterally spaced apart from the pair of TFR heads and electrically connected to the metal cup structure;
 wherein the at least one metal cup structure contact defines a closed-loop perimeter in a horizontal plane.

21. The TFR module of claim 19, wherein the metal cup structure is electrically grounded to reduce interference effects on the TFR module.

22. The TFR module of claim 19, wherein:
 the TFR element includes (a) a laterally-extending TFR element base and (b) multiple TFR element sidewalls extending upwardly from the laterally-extending TFR element base; and
 the multiple TFR element sidewalls extending upwardly from the laterally-extending TFR element base include:
  a first pair of TFR element sidewalls extending upwardly from a first pair of opposite sides of the laterally-extending TFR element base; and
  a second pair of TFR element sidewalls extending upwardly from a second pair of opposite sides of the laterally-extending TFR element base;
 wherein a vertical height of the first pair of TFR element sidewalls is greater than a vertical height of a portion of the second pair of TFR element sidewalls.

* * * * *